US 9,754,820 B2

(12) United States Patent
Tsutsumi et al.

(10) Patent No.: US 9,754,820 B2
(45) Date of Patent: Sep. 5, 2017

(54) THREE-DIMENSIONAL MEMORY DEVICE CONTAINING AN ALUMINUM OXIDE ETCH STOP LAYER FOR BACKSIDE CONTACT STRUCTURE AND METHOD OF MAKING THEREOF

(71) Applicant: SANDISK TECHNOLOGIES INC., Plano, TX (US)

(72) Inventors: Masanori Tsutsumi, Yokkaichi (JP); Motoki Kawasaki, Yokkaichi (JP); Rahul Sharangpani, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/012,124

(22) Filed: Feb. 1, 2016

(65) Prior Publication Data

US 2017/0221756 A1 Aug. 3, 2017

(51) Int. Cl.
*H01L 29/76* (2006.01)
*H01L 21/768* (2006.01)
(Continued)

(52) U.S. Cl.
CPC .. *H01L 21/76831* (2013.01); *H01L 21/76802* (2013.01); *H01L 21/76879* (2013.01);
(Continued)

(58) Field of Classification Search
USPC ....... 257/751, 774, 762, 200, 758, 288, 298, 257/776, E21.586, E21.579, 773, 374,
(Continued)

(56) References Cited

U.S. PATENT DOCUMENTS 5,915,167 A 6/1999 Leedy
7,005,350 B2 2/2006 Walker et al.
(Continued)

FOREIGN PATENT DOCUMENTS

WO WO 02/15277 A2 2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Tram H Nguyen
(74) *Attorney, Agent, or Firm* — The Marbury Law Group PLLC

(57) ABSTRACT

Collateral etching of a dielectric material around a trench during formation of a substrate contact via structure can be avoided employing an aluminum oxide layer. The aluminum oxide layer functions as an etch stop layer during an anisotropic etch that removes horizontal portions of an insulating material layer to form an insulating spacer. The aluminum oxide layer may be a conformal or a non-conformal material layer, and may, or may not, include a horizontal portion that overlies an alternating stack of insulating layers and electrically conductive layers. Electrical shorts caused by widening of the top portion of the trench can be avoided through use of the aluminum oxide layer. Memory stack structures can extend through the alternating stack to provide a three-dimensional memory stack structure. A source region can be formed underneath the trench, and the substrate contact via structure can be employed as a source contact via structure.

24 Claims, 23 Drawing Sheets

(51) Int. Cl.

| | |
|---|---|
| *H01L 27/11524* | (2017.01) |
| *H01L 27/11556* | (2017.01) |
| *H01L 27/1157* | (2017.01) |
| *H01L 27/11582* | (2017.01) |
| *H01L 23/522* | (2006.01) |

(52) U.S. Cl.
CPC ...... *H01L 23/5226* (2013.01); *H01L 27/1157* (2013.01); *H01L 27/11524* (2013.01); *H01L 27/11556* (2013.01); *H01L 27/11582* (2013.01)

(58) Field of Classification Search
USPC ......... 257/499–564, 763, 757; 438/762, 639, 438/643, 687, 637, 485, 785
See application file for complete search history.

(56) References Cited

U.S. PATENT DOCUMENTS

| | | |
|---|---|---|
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,696,559 B2 | 4/2010 | Arai et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi et al. |
| 8,053,829 B2 | 11/2011 | Kang et al. |
| 8,187,936 B2 | 5/2012 | Alsmeier et al. |
| 8,394,716 B2 | 3/2013 | Hwang et al. |
| 9,023,719 B2 | 5/2015 | Pachamuthu et al. |
| 9,230,984 B1 | 1/2016 | Takeguchi |
| 9,236,396 B1 | 1/2016 | Koka et al. |
| 2007/0210338 A1 | 9/2007 | Orlowski |
| 2007/0252201 A1 | 11/2007 | Kito et al. |
| 2008/0116583 A1 | 5/2008 | Yuki |
| 2009/0230449 A1 | 9/2009 | Sakaguchi et al. |
| 2009/0242967 A1 | 10/2009 | Katsumata et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0012920 A1 | 1/2012 | Shin et al. |
| 2012/0119287 A1 | 5/2012 | Park et al. |
| 2013/0126957 A1 | 5/2013 | Higashitani et al. |
| 2013/0264631 A1 | 10/2013 | Alsmeier et al. |
| 2015/0076584 A1 | 3/2015 | Pachamuthu et al. |
| 2016/0300848 A1* | 10/2016 | Pachamuthu ......... H01L 21/768 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

Office Communication Concerning Corresponding U.S. Appl. No. 14/501,539, filed Sep. 30, 2014, (19 pages).

U.S. Appl. No. 14/462,209, filed Aug. 14, 2014, SanDisk Technologies Inc.

U.S. Appl. No. 14/468,743, filed Aug. 26, 2014, SanDisk Technologies Inc.

U.S. Appl. No. 14/491,026, filed Sep. 19, 2014, SanDisk Technologies Inc.

U.S. Appl. No. 14/491,315, filed Sep. 19, 2014, SanDisk Technologies Inc.

U.S. Appl. No. 14/517,134, filed Oct. 17, 2014, SanDisk Technologies Inc.

U.S. Appl. No. 14/539,372, filed Dec. 11, 2014, SanDisk Technologies Inc.

U.S. Appl. No. 14/540,479, filed Nov. 13, 2014, SanDisk Technologies Inc.

U.S. Appl. No. 14/602,491, filed Jan. 22, 2015, SanDisk Technologies Inc.

U.S. Appl. No. 14/723,919, filed May 28, 2015, SanDisk Technologies Inc.

U.S. Appl. No. 14/748,871, filed Jun. 24, 2015, SanDisk Technologies Inc.

U.S. Appl. No. 14/925,171, filed Oct. 28, 2015, SanDisk Technologies Inc.

* cited by examiner

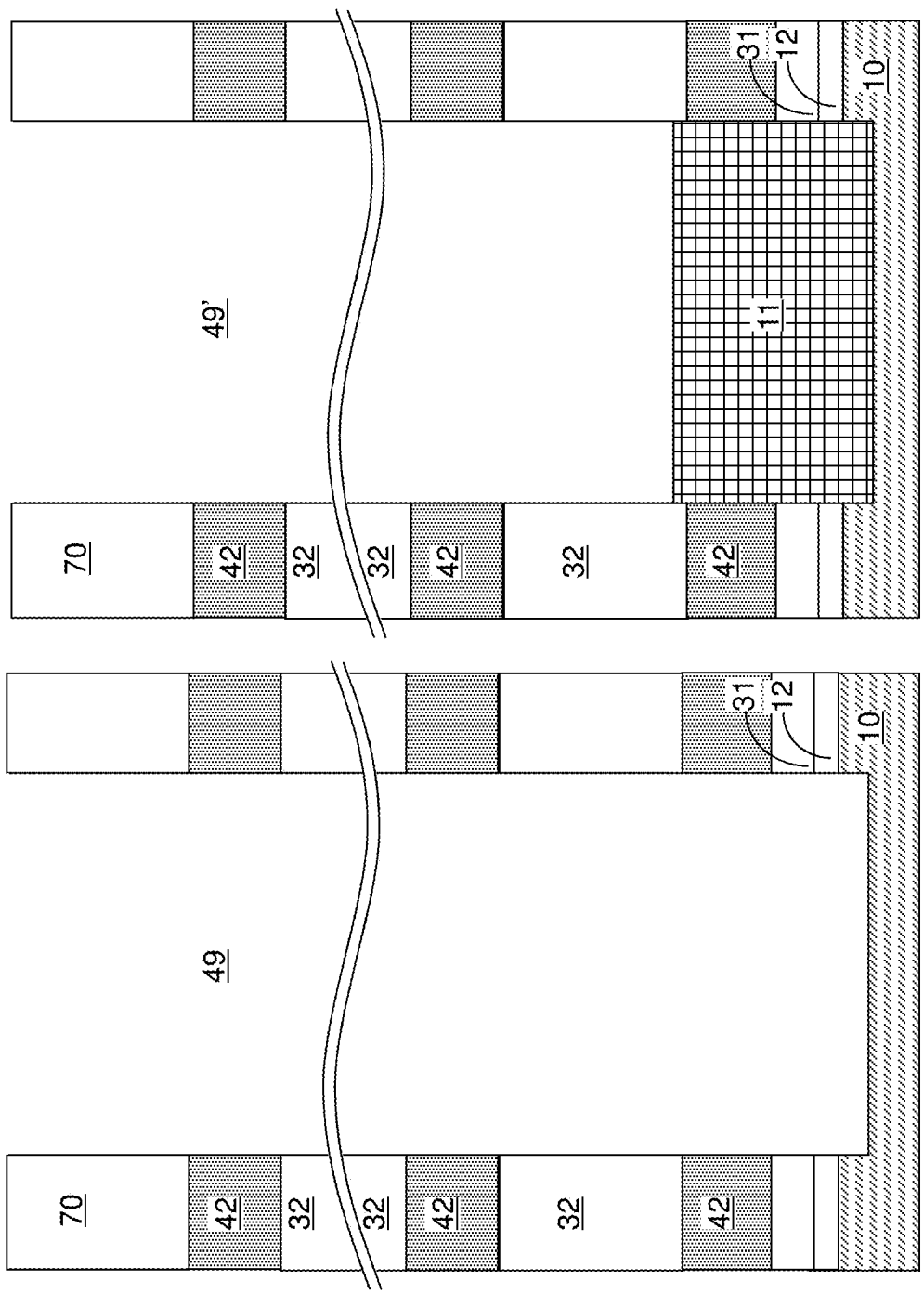

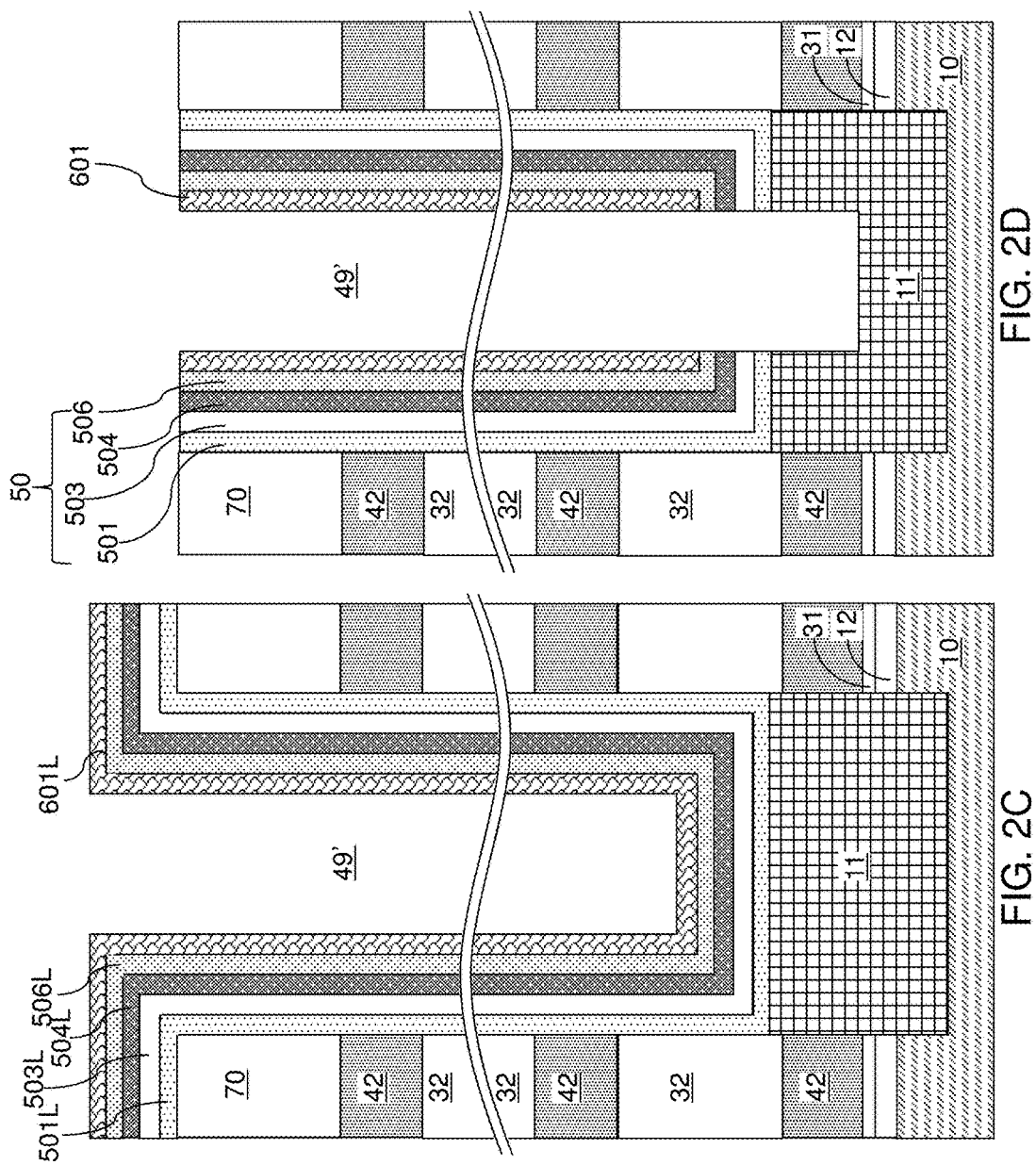

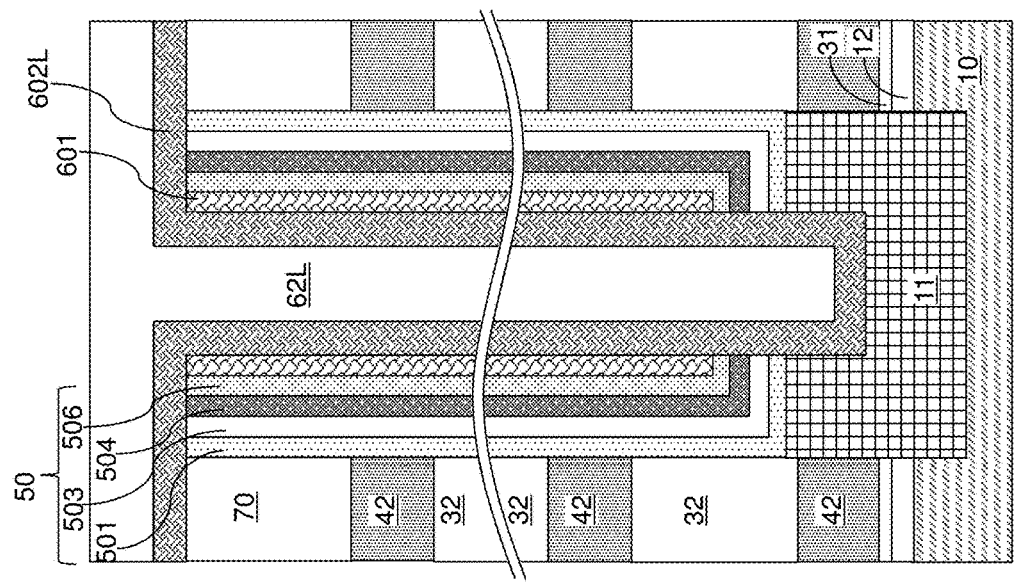
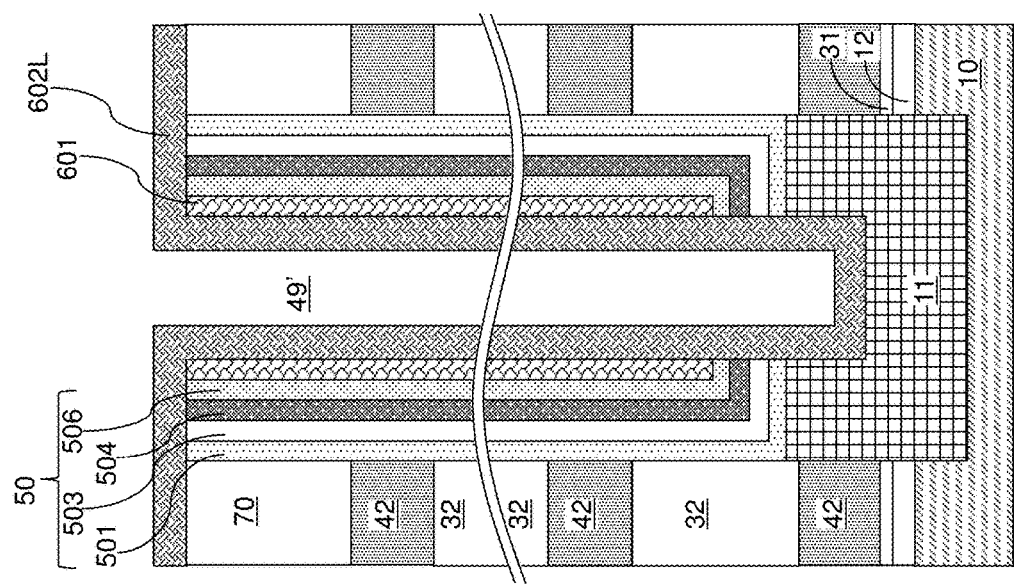

THREE-DIMENSIONAL MEMORY DEVICE CONTAINING AN ALUMINUM OXIDE ETCH STOP LAYER FOR BACKSIDE CONTACT STRUCTURE AND METHOD OF MAKING THEREOF

FIELD

The present disclosure relates generally to the field of three-dimensional memory devices and specifically to three-dimensional memory devices including a vertical stack of multilevel memory arrays and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of making a device structure comprises forming a stack of alternating layers comprising insulating layers and electrically conductive layers over a substrate, forming a trench through the stack of alternating layers, forming an aluminum oxide layer over at least an upper portion of a sidewall of the trench, forming an insulating layer over a sidewall of the aluminum oxide layer and over a bottom of the trench, etching the insulating layer to remove the insulating layer from over the bottom of the trench to form an insulating spacer using the aluminum oxide layer as an etch stop, and forming a contact via structure inside the insulating spacer in the trench.

According to an aspect of the present disclosure, a three-dimensional memory device comprises an alternating stack of insulating layers and electrically conductive layers located over a substrate, a trench extending through the stack of alternating layers, an aluminum oxide layer located over at least an upper portion of a sidewall of the trench, an insulating spacer located over a sidewall of the aluminum oxide layer, and a contact via structure located inside the insulating spacer in the trench.

BRIEF DESCRIPTION OF THE DRAWINGS

FIGS. 2A-2H are sequential vertical cross-sectional views of a memory opening within the first exemplary structure during various processing steps employed to form a memory stack structure according to the first embodiment of the present disclosure.

DETAILED DESCRIPTION

Figure 1:
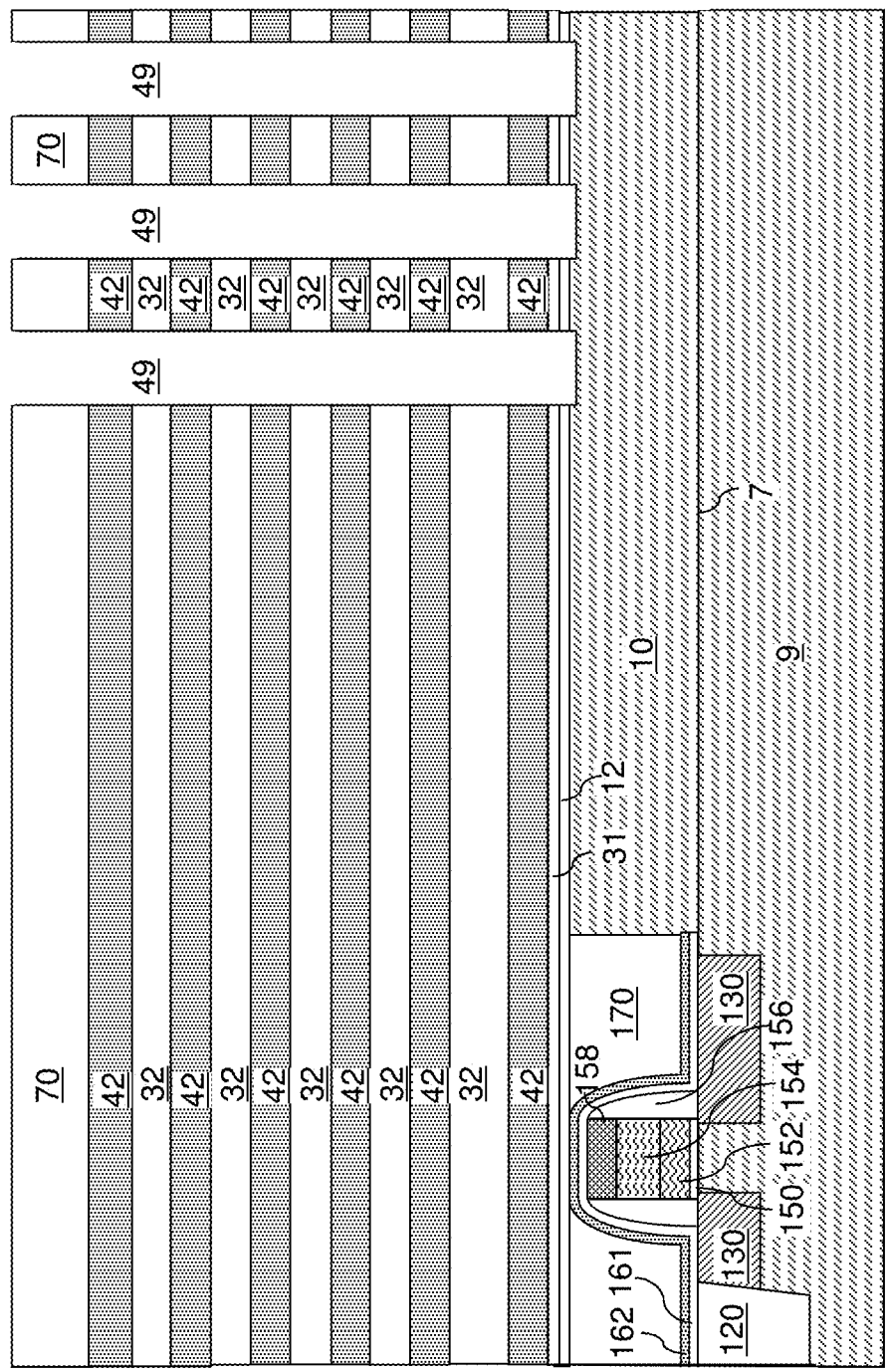
FIG. 1 is a vertical cross-sectional view of a first exemplary structure after formation of a stack including an alternating plurality of material layers and memory openings extending through the stack according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to the first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (e.g., a p-type well not expressly shown) can be formed within the substrate semiconductor layer 9 and/or the semiconductor material layer 10 located over the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above (e.g., single crystalline silicon). The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed over the top surfaces of the gate electrode(s) (152, 154, 158) and over the dielectric pad layer 12. Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrode(s).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the first exemplary structure during formation of an exemplary memory stack structure according to a first embodiment of the present disclosure. Formation of the exemplary memory stack structure can be performed within each of the memory openings 49 in the first exemplary structure illustrated in FIG. 1.

Referring to FIG. 2A, a memory opening 49 in the first exemplary structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10 (e.g., p-type single crystalline silicon). In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2C, a series of layers including at least one blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506L, 601L).

Referring to FIG. 2D, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a continuous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 506, the charge storage element 504, and the at least one blocking dielectric (501, 503). Optionally, the physically exposed portion of the epitaxial channel portion 11 can be vertically recessed. A tunneling dielectric 506 is surrounded by a charge storage element 504. The charge storage element 504 can comprise a charge trapping material or a floating gate material.

The set of the tunneling dielectric 506, the charge storage element 504, the second blocking dielectric 503, and the first blocking dielectric 501 collectively constitutes a memory film 50. In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 2G:
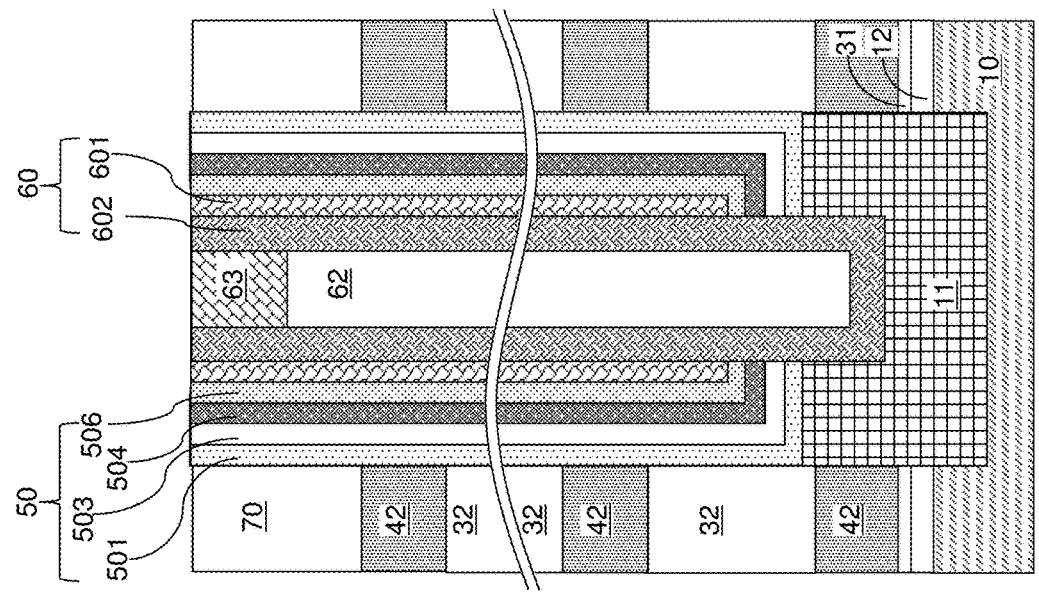

Referring to FIG. 2G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is surrounded by a charge storage element 504, and laterally surrounds a portion of the semiconductor channel 60. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core 62 can be further recessed within each memory opening, for example, by a recess etch to a depth that is located between the top surface of the insulating cap layer 70 and the bottom surface of the insulating cap layer 70.

Figure 2H:
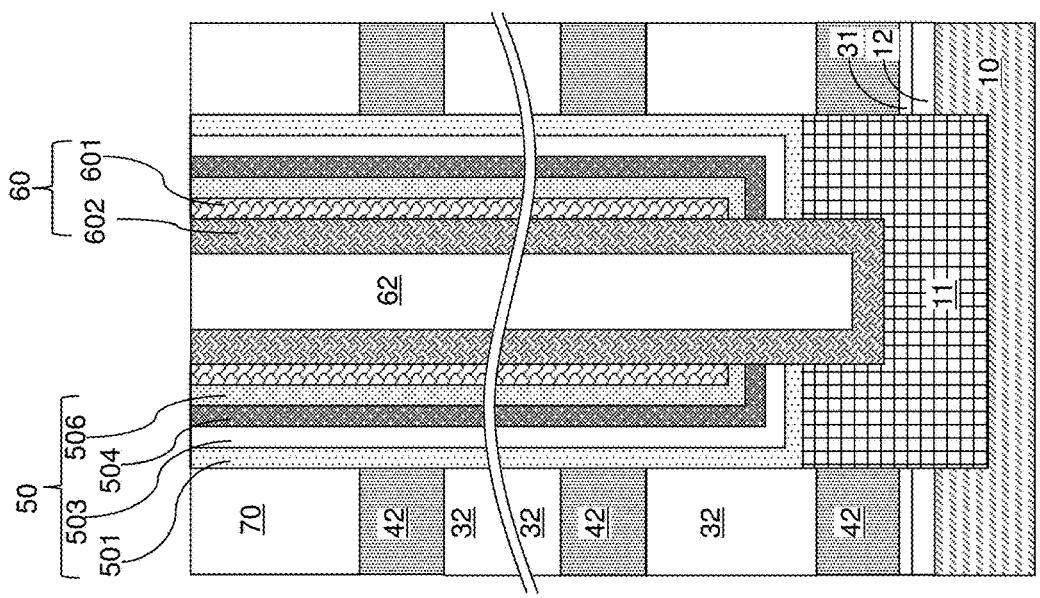

Referring to FIG. 2H, drain regions 63 can be formed by depositing a doped semiconductor material within each recessed region above the dielectric cores 62. The doped semiconductor material can be, for example, doped polysilicon formed by at least one of in-situ doping and ion implantation doping or a combination thereof. The highly doped drain regions near the drain side select gates provide a low resistive contact region for a bit line connection. Excess portions of the deposited semiconductor material can be removed from above the top surface of the insulating cap layer 70, for example, by chemical mechanical planarization (CMP) or a recess etch to form the drain regions 63.

Each set of a memory film 50 and a semiconductor channel 60 comprising at least one layer (601, 602) in a same memory opening constitutes a memory stack structure 55. The memory stack structures 55 are formed through the in-process alternating stack of the insulating layers 32 and sacrificial material layers 42.

Figure 3:
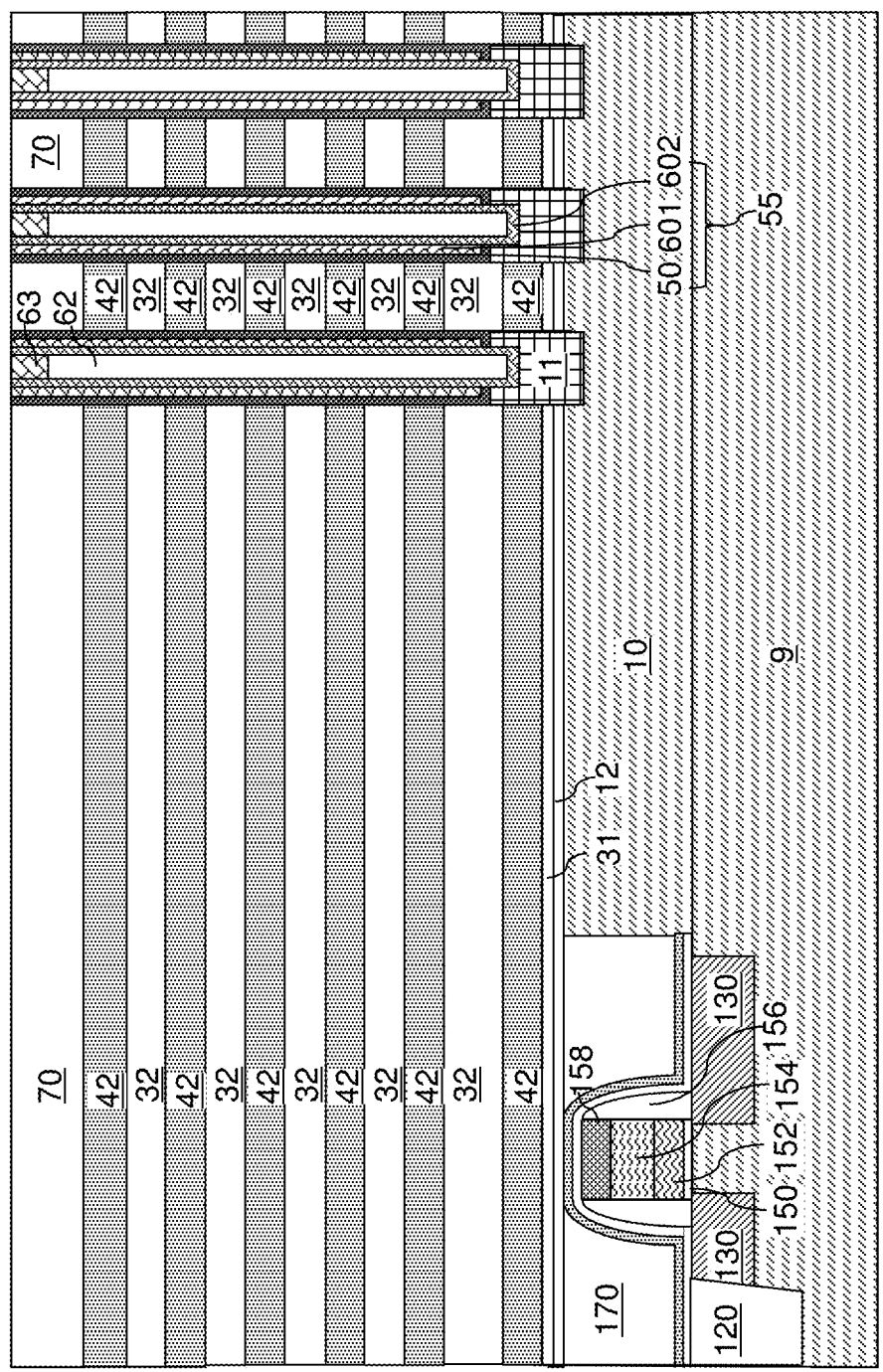
FIG. 3 is a vertical cross-sectional view of the first exemplary structure after formation of memory stack structures according to the first embodiment of the present disclosure.

The exemplary memory stack structure 55 can be embedded into the first exemplary structure illustrated in FIG. 1. FIG. 3 illustrates the first exemplary structure that incorporates multiple instances of the exemplary memory stack structure of FIG. 2F. The first exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
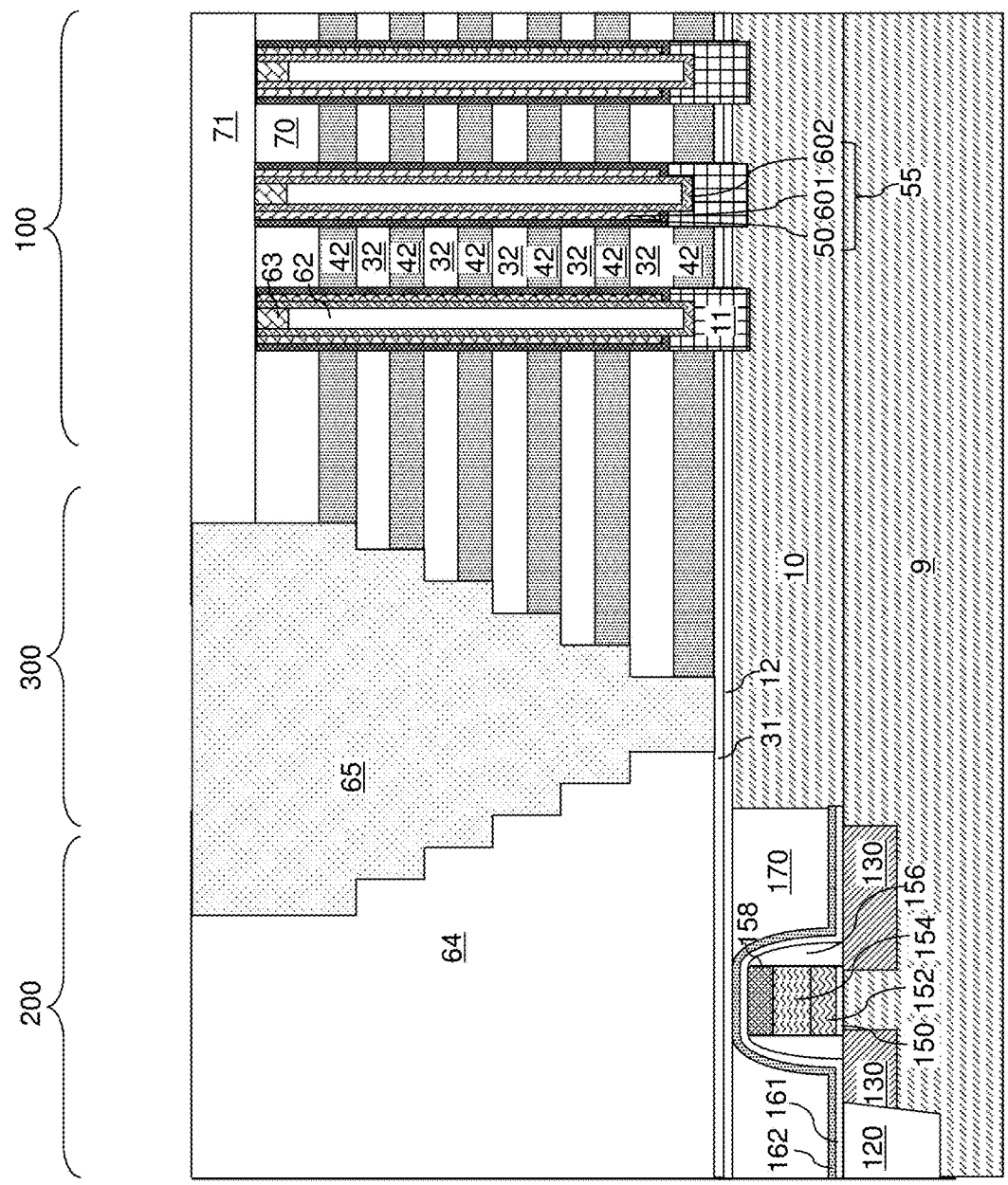
FIG. 4 is a vertical cross-sectional view of the first exemplary structure after formation of a stepped terrace and a retro-stepped dielectric material portion according to the first embodiment of the present disclosure.

Referring to FIG. 4, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
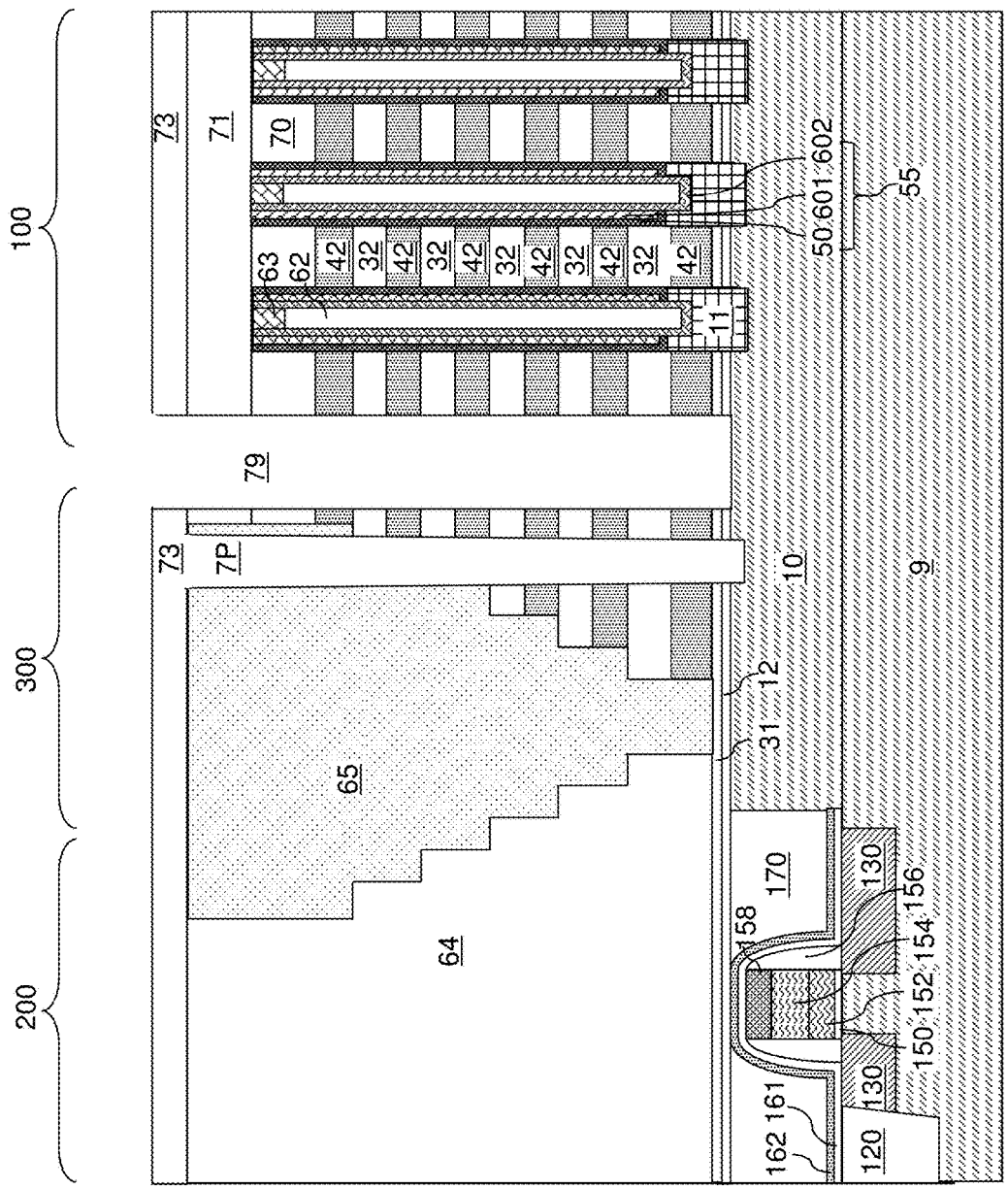
FIG. 5A is a vertical cross-sectional view of the first exemplary structure after formation of a backside trench according to the first embodiment of the present disclosure.
Figure 5B:
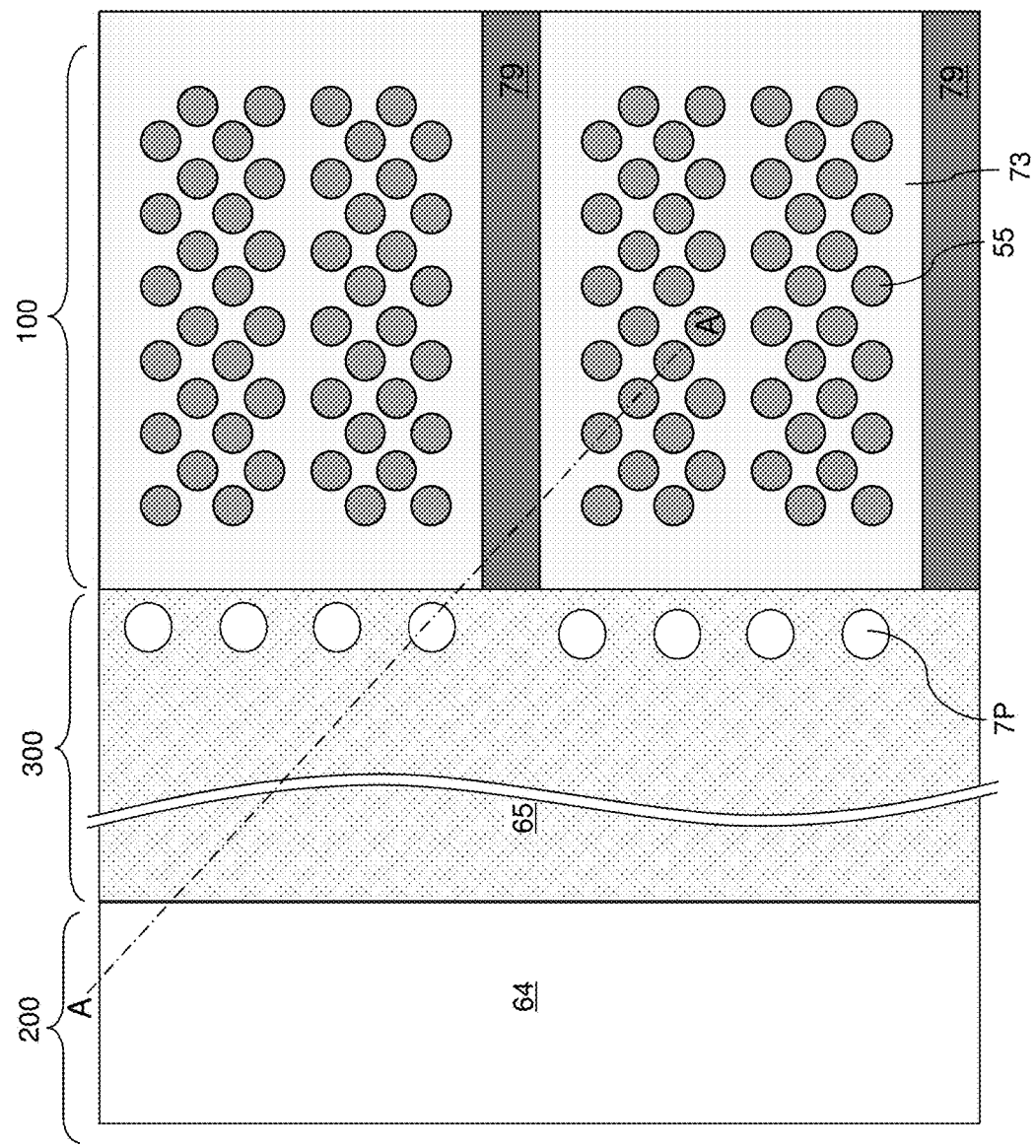
FIG. 5B is a partial see-through top-down view of the first exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the first contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a substrate contact via structure.

The second contact level dielectric layer 73 and the at least one dielectric support pillar 7P can be formed as a single continuous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

A photoresist layer (not shown) can be applied over the alternating stack (32, 42) and/or the retro-stepped dielectric material portion 65, and lithographically patterned to form at least one trench. Each of the at least one trench is herein referred to as a backside trench 79, i.e., a trench that is located in a different region than the memory stack structures 55 that are formed in the memory openings (which are referred to as front side openings). Each backside trench 79 can be formed in an area in which formation of a substrate contact via structure is desired. The trench 79 may extend through region 100 or through both regions 100 and 300. The pattern in the photoresist layer can be transferred through the alternating stack (32, 42) and/or the retro-stepped dielectric material portion 65 employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Figure 6:
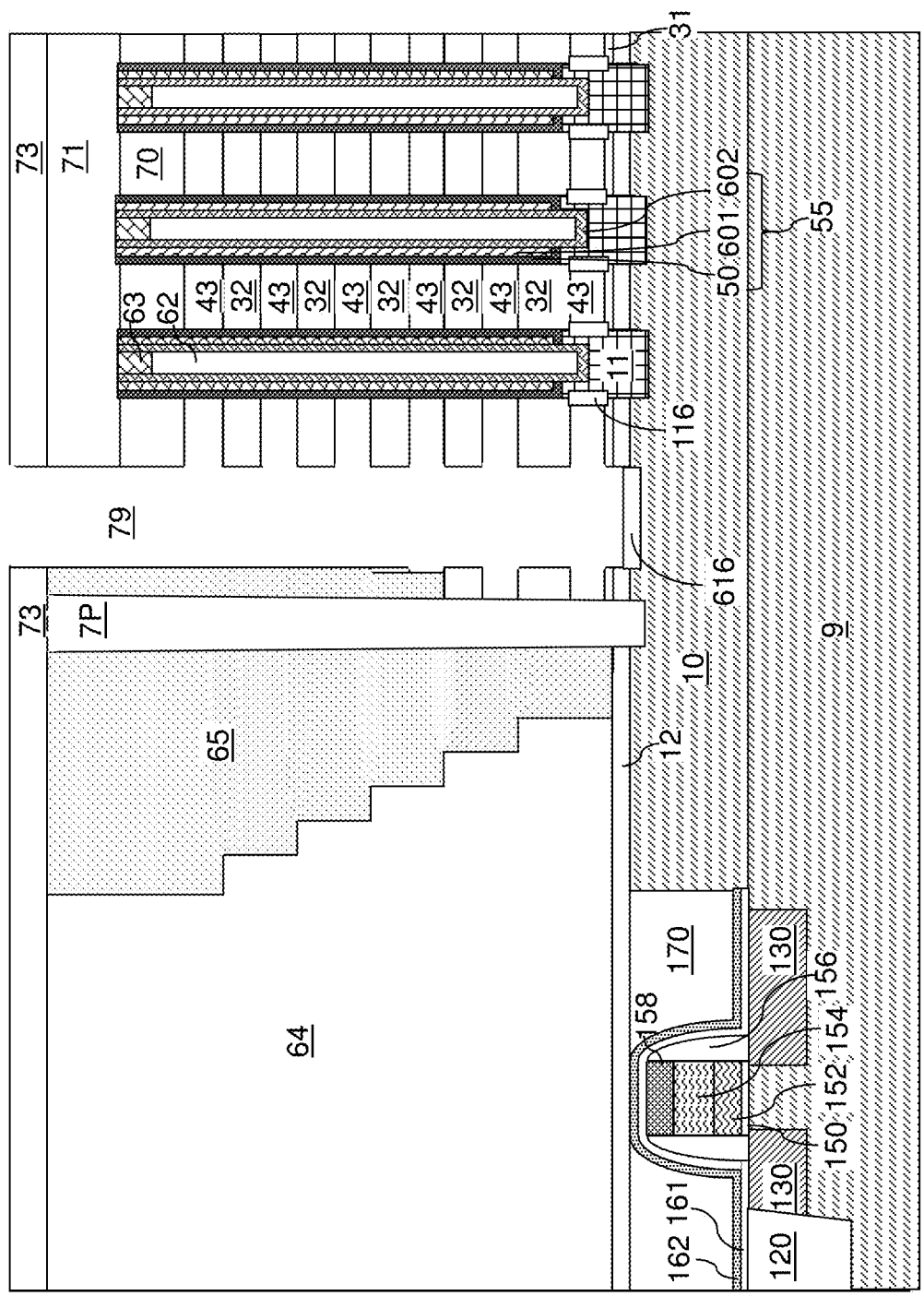
FIG. 6 is a vertical cross-sectional view of the first exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced through the at least one backside trench 79, for example, employing an etch process. Backside recesses 43 are formed in volumes from which the sacrificial material layers 42 are removed.

The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side holes in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the semiconductor material layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the semiconductor material layer 10 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor material layer 10.

Figure 7:
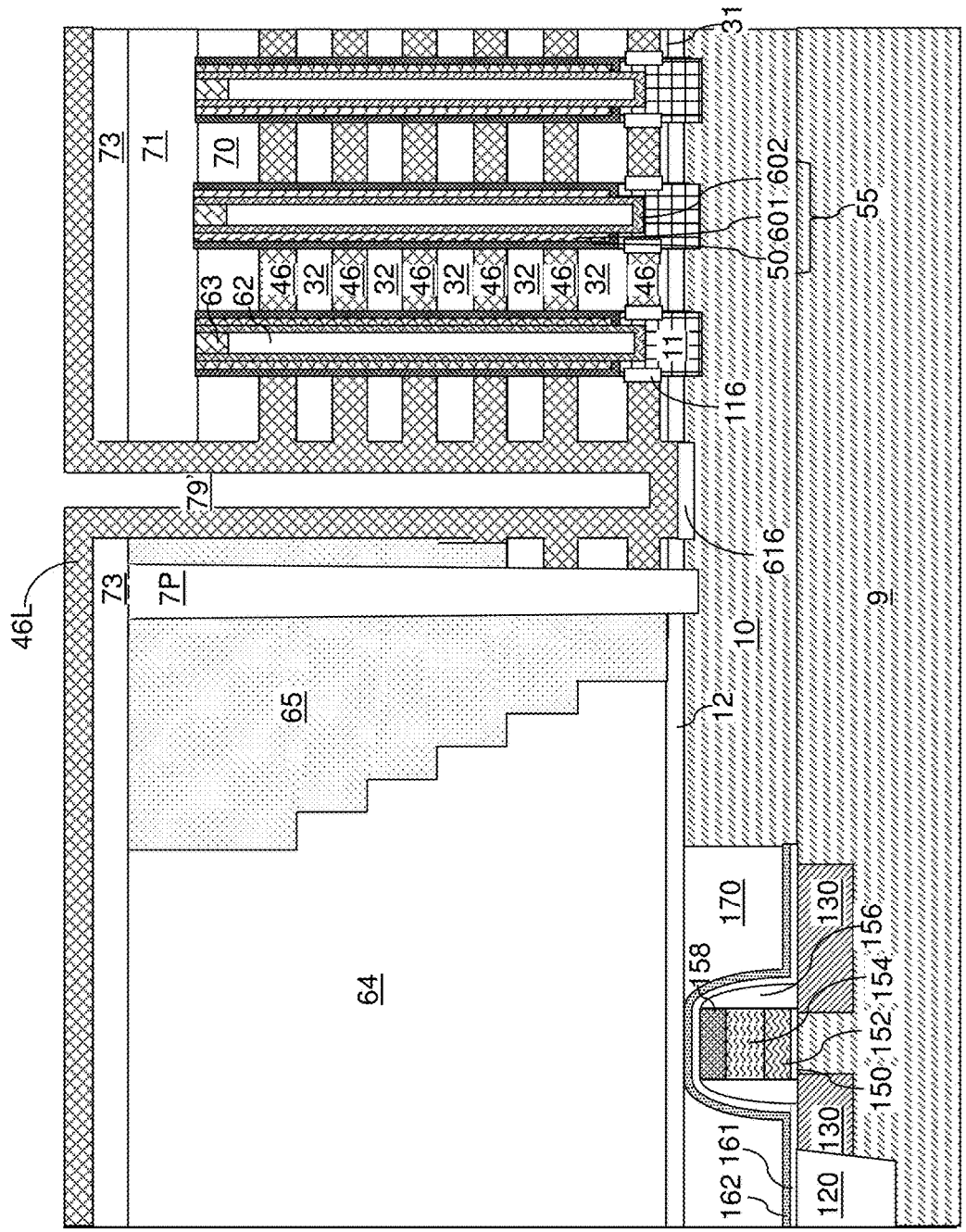
FIG. 7 is a vertical cross-sectional view of the first exemplary structure after formation of electrically conductive layers according to the first embodiment of the present disclosure.

Referring to FIG. 7, a backside blocking dielectric layer (not shown) can be optionally formed. The backside blocking dielectric layer, if present, comprises a dielectric material that functions as a control gate dielectric for the control gates to be subsequently formed in the backside recesses 43. In case a blocking dielectric (501, 503) is present within each memory opening, the backside blocking dielectric layer is optional. In case a blocking dielectric layer (501, 503) is omitted, the backside blocking dielectric layer is present.

At least one metallic material can be deposited in the plurality of backside recesses 43, on the sidewalls of the at least one the backside trench 79, and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas can comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses 43, and a continuous metallic material layer 46L can be formed on the sidewalls of each backside trench 79 and over the at least one contact level dielectric layer (71, 73). Thus, each sacrificial material layer 42 can be replaced with an electrically conductive layer 46. A backside cavity 79' is present in the portion of each backside trench 79 that is not filled with the backside blocking dielectric layer 66 and the continuous metallic material layer 46L.

Figure 8:
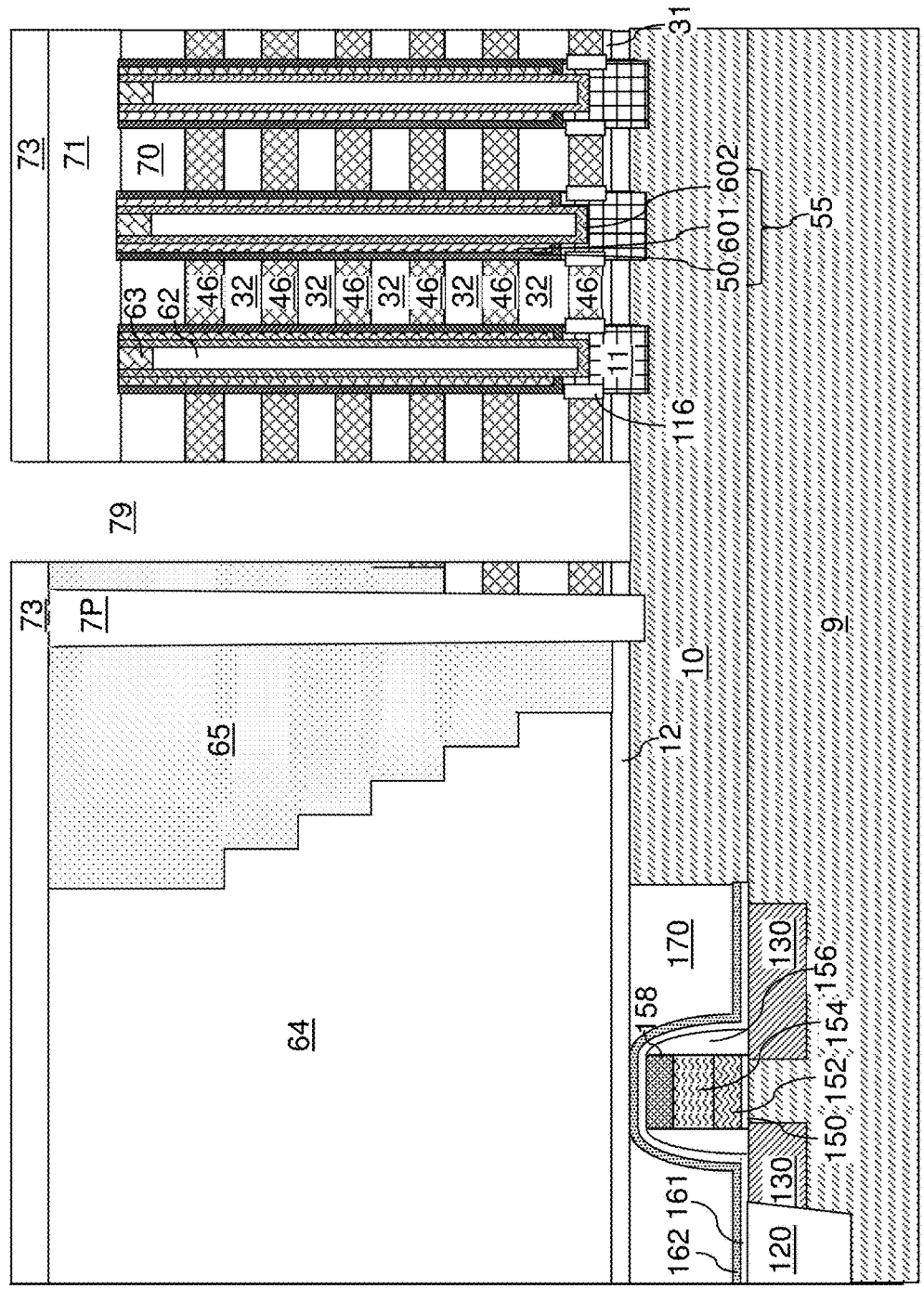
FIG. 8 is a vertical cross-sectional view of the first exemplary structure after removal of a deposited conductive material from within the backside trench according to the first embodiment of the present disclosure.

Referring to FIG. 8, the deposited metallic material of the continuous metallic material layer 46L is etched back from the sidewalls of each backside trench 79 and from above the second contact level dielectric layer 73, for example, by an isotropic wet etch or dry etch or the combination of isotropic wet etch and dry etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the semiconductor material layer 10 during the last processing step of the anisotropic etch.

The in-process alternating stack of the insulating layers 32 and sacrificial material layers 42 is modified during the processing steps of FIGS. 6-8 to form an alternating stack of the insulating layer 32 and the electrically conductive layers 46.

Figure 9:
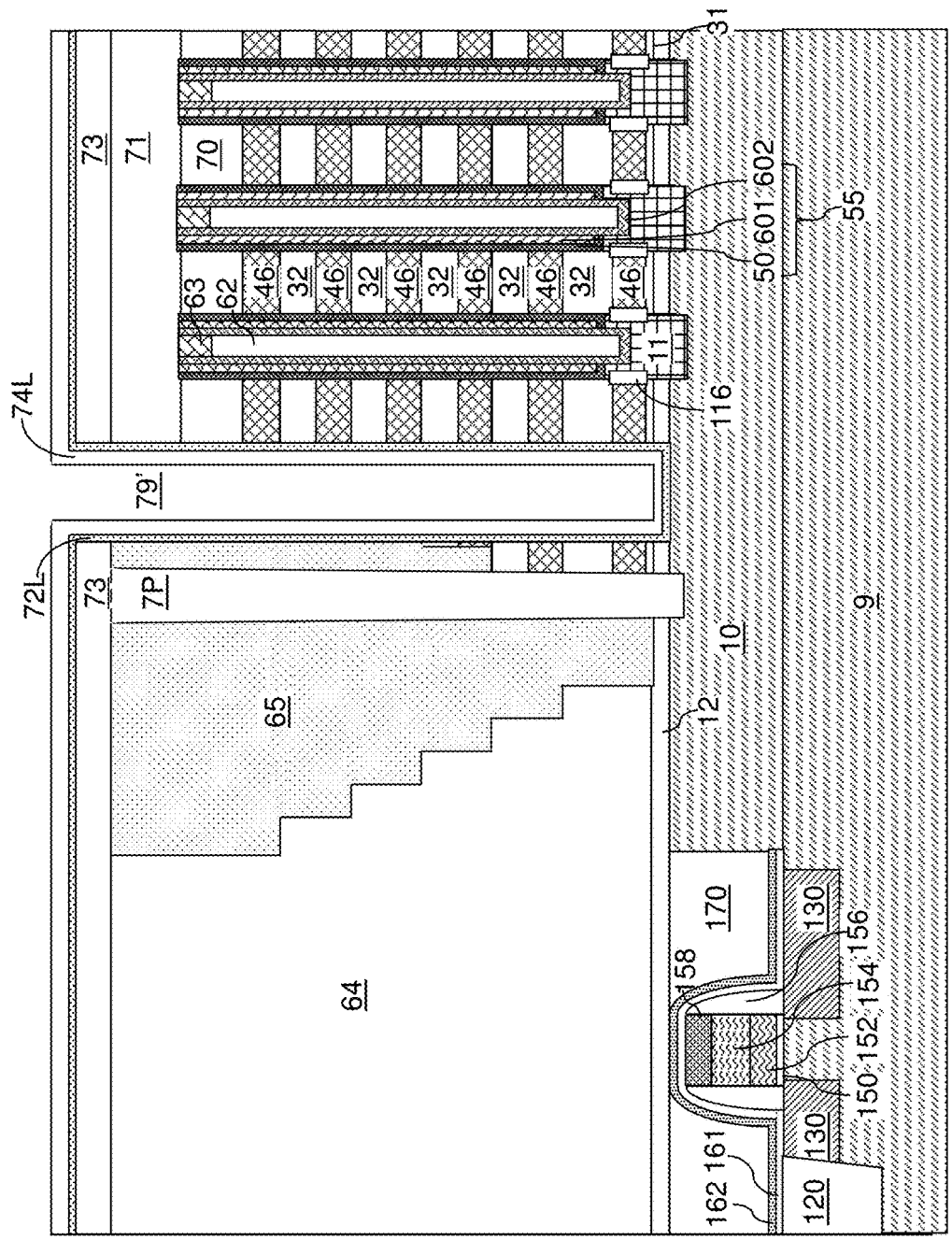
FIG. 9 is a vertical cross-sectional view of the first exemplary structure after formation of a continuous conformal aluminum oxide layer and an insulating material layer according to the first embodiment of the present disclosure.

Referring to FIG. 9, a continuous conformal aluminum oxide layer 72L can be deposited on the sidewall of each backside trench 79, on a top surface of the substrate (9, 10), and a top surface of the at least one contact level dielectric layer (71, 73). The continuous conformal aluminum oxide layer 72L can be deposited, for example, by an atomic layer deposition (ALD) process (e.g., using trimethylaluminum and water as precursors) or a chemical vapor deposition (CVD) process that is performed in a temperature-limited deposition mode.

As used herein, a "temperature-limited deposition mode" is a deposition mode in which the deposition rate is limited by the temperature, and is not limited by the amount of available reactant. In other words, the process provides sufficient amount of reactants to each physically exposed surface within the backside trench 79 to provide the same deposition rate throughout. Thus, the continuous conformal aluminum oxide layer 72L has a substantially uniform thickness throughout on the sidewall of the backside trench 79. As used herein, an element has a "substantially uniform thickness" if the variation of the thickness is less than 10% of the average thickness of the element. The thickness (i.e., the average thickness) of the continuous conformal aluminum oxide layer 72L can be in a range from 1.5 nm to 10 nm (such as from 2 nm to 6 nm), although lesser and greater thicknesses can also be employed.

The continuous conformal aluminum oxide layer 72L can be deposited on the entirety of the sidewall of each backside trench 79. Therefore, the continuous conformal aluminum oxide layer 72L is deposited on sidewalls of all of the electrically conductive layers 46 in the alternating stack (32, 46), and on sidewalls of all of the insulating layers 32 in the alternating stack (32, 46).

An insulating material layer 74L can be deposited over the continuous conformal aluminum oxide layer 72L by a conformal deposition process such as a chemical vapor deposition process. The insulating material layer 74L includes a dielectric material such as silicon oxide, silicon nitride, silicon oxynitride, or a combination thereof. In one embodiment, the insulating material 74L can include undoped silicate glass (USG). The thickness of the insulating material layer 74L can be in a range from 3 nm to 30 nm, although lesser and greater thicknesses can also be employed.

Figure 10:
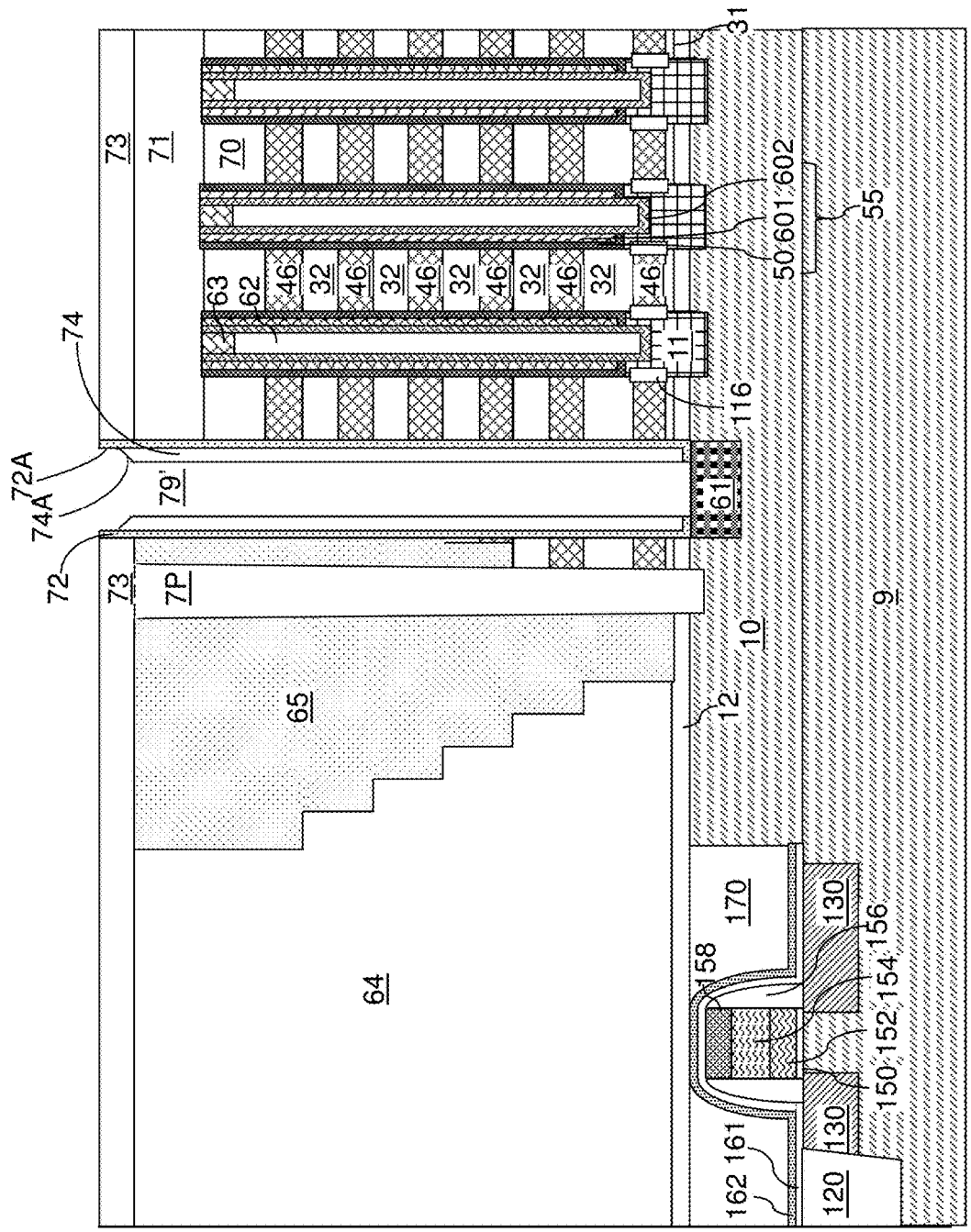
FIG. 10 is a vertical cross-sectional view of the first exemplary structure after formation of an insulating spacer and removal of horizontal portions of the continuous conformal aluminum oxide layer to form an aluminum oxide layer according to the first embodiment of the present disclosure.

Referring to FIG. 10, an anisotropic etch can be performed to remove horizontal portions of the insulating material layer 74L from above the at least one contact level dielectric layer (71, 73) and from a bottom portion of each backside trench 79. The anisotropic etch can be a reactive ion etch that etches the dielectric material of the insulating material layer 74L selective to the aluminum oxide material of the continuous conformal aluminum oxide layer. In one embodiment, the reactive ion etch can employ at least one fluorocarbon etchant such as $CF_4$ and/or $CHF_3$, and optionally oxygen. Such fluorocarbon-based reactive ion etch chemistries are generally selective to aluminum oxide. Each remaining portion of the insulating material layer 74L constitutes an insulating spacer 74.

In case a portion of the backside trench 79 has a substantially rectangular horizontal cross-sectional area, the insulating spacer 74 can have a pair of parallel vertical portions laterally spaced from each other by a uniform distance. Further, each parallel vertical portion of the insulating spacer 74 can have a uniform lateral thickness at a bottom portion and a middle portion. The anisotropic etch can cause formation of tapers 74A at the top portion of each insulating spacer 74. In this case, each insulating spacer 74 can have a tapered profile at a top portion. In other words, the lateral thickness of each insulating spacer 74 can decrease with a vertical distance from the top surface of the substrate (9, 10). Thus, the insulating material layer 74L is etched to remove the insulating material layer from over the bottom of the trench 79 to form the insulating spacer 74 with an optional taper 74A using the aluminum oxide layer 72 as an etch stop. The etching of the insulating layer may form the taper at the top portion of the insulating spacer and may expose an upper portion 72A of the aluminum oxide layer 72 above the taper 74A in the top portion of the insulating layer in the trench 79. The contact via structure 76 may contact the exposed upper portion 72A of the aluminum oxide layer 72. Further, an overetch can be performed to remove the horizontal portion of the insulating material layer 74L from a bottom portion of each backside trench 79 after removal of the horizontal portion of the insulating material layer 74L from above the at least one contact level dielectric layer (71, 73) due to inherently lesser supply of the etchant to the bottom of the backside trenches 79 than to the region overlying the at least one contact level dielectric layer (71, 73). The overetch can lead to recessing of the top portion of each insulating spacer 74 with respect to a horizontal plane including the topmost surface of the at least one contact level dielectric layer (71, 73). In one embodiment, the insulating spacer 74 can be topologically homeomorphic to a torus. As used herein, an element is "topologically homeomorphic to a torus" if the element can be continuously deformed without creating a new hole or destroying a pre-existing hole into the shape of a torus.

Subsequently, an etch process can be employed to remove horizontal portions of the continuous conformal aluminum oxide layer 72L selective to the insulating spacer 74 which may comprise silicon oxide. The etch process can be an anisotropic etch process which preferentially etches the aluminum oxide layer 72 over the silicon oxide of the spacer 74, which can preserve the vertical portion of the continuous conformal aluminum oxide layer 72L at the top portion of each backside trench 79. An exemplary anisotropic etch process that can be employed to etch the horizontal portions of the continuous conformal aluminum oxide layer 72L is a reactive ion etch employing $CCl_4$ and optionally Ar, or $BCl_3$ and optionally oxygen and/or Ar. Each discrete remaining portion of the continuous conformal aluminum oxide layer 72L constitutes an aluminum oxide layer 72. Each aluminum oxide layer 72 can be topologically homeomorphic to a torus. Each insulating spacer 74 is formed on an inner sidewall of a respective aluminum oxide layer 72.

In one embodiment, each sidewall of the backside trenches 79 can extend substantially vertically from the substrate (9, 10) to a topmost layer in the alternating stack (32, 46) and further to the topmost surface of the at least one contact level dielectric layer (71, 73). As used herein, a surface is "substantially vertical" if the surface does not deviate from, or devices by no more than 5 degrees from, a vertical plane. In this case, the entire outer sidewall of each aluminum oxide layer 72 can contact the sidewall of the backside trench 79. Further, each aluminum oxide layer 72 can have a substantially uniform thickness (lateral thickness) between the substrate (9, 10) and the horizontal plane including the topmost surface of the at least one contact level dielectric layer (71, 73). A backside cavity 79' is present in an unfilled volume of each backside trench 79.

A source region 61 can be formed in a surface portion of the substrate (e.g., in the semiconductor material layer 10) underneath each backside trench 79. Each source region 61 can be formed by implanting electrical dopants through each backside trench 79 into a semiconductor portion located on, or within, the substrate (9, 10). For example, a source region 61 may be formed by implantation of dopant atoms into a portion of the semiconductor material layer 10 through each backside trench 79. Alternatively, a source region 61 can be formed on the substrate (9, 10) as a doped semiconductor portion by deposition of a semiconductor material, for example, by selective epitaxy, and by implantation of electrical dopants into the deposited semiconductor portion. In an alternative process, the source region 61 may be formed during an earlier processing step, such as during the steps shown in FIG. 5A or in FIG. 8.

Figure 11:
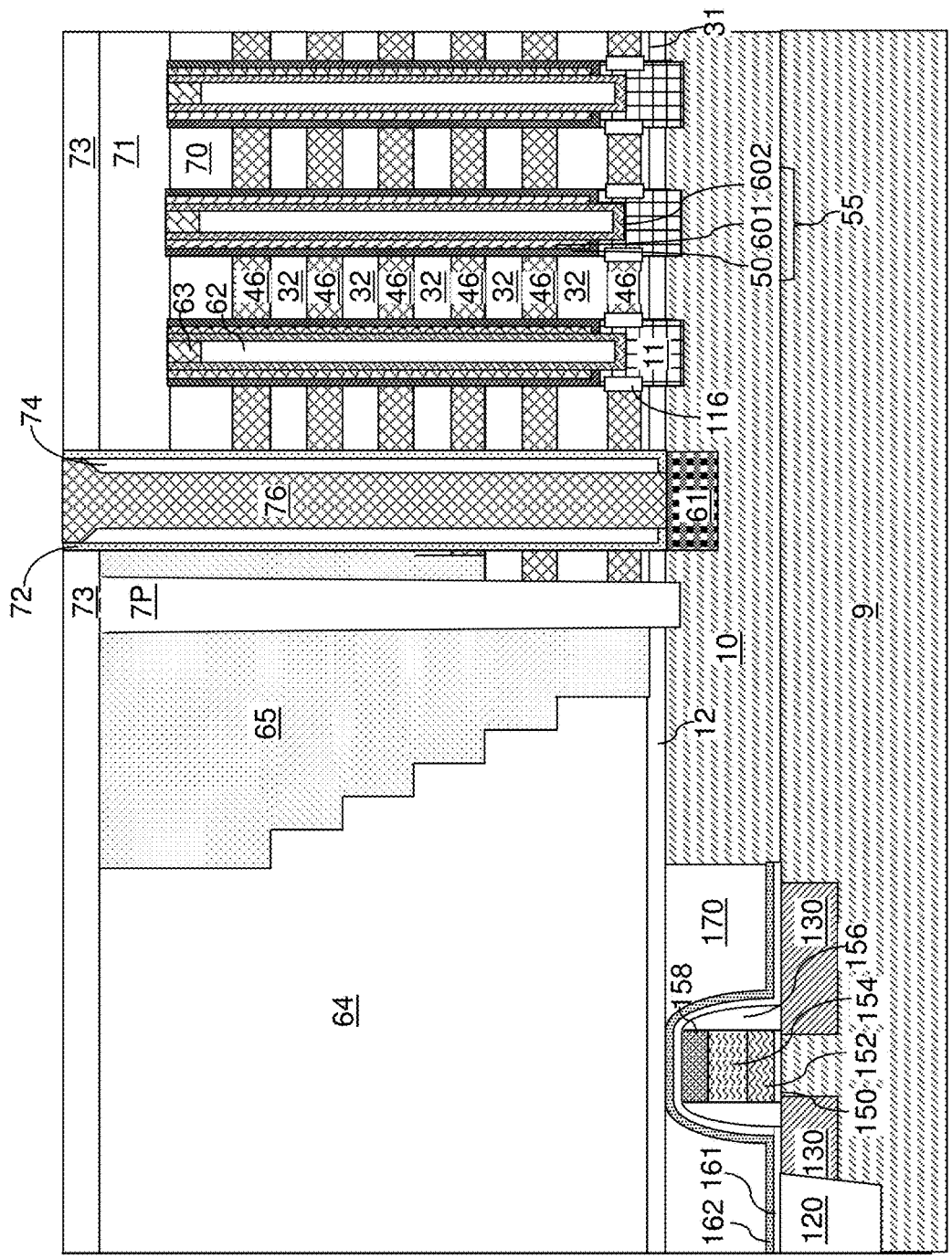
FIG. 11 is a vertical cross-sectional view of the first exemplary structure after formation of a substrate contact via structure according to the first embodiment of the present disclosure.

Referring to FIG. 11, at least one conductive material can be deposited to fill each backside cavity 79'. The at least one conductive material can include, for example, a combination of a conductive metallic nitride (such as TiN, TaN, or WN) that can be employed to form a conductive diffusion barrier layer, and a conductive fill material (such as W, Cu, Al, Ru, Co, and/or a heavily doped conductive semiconductor material). The at least one conductive material can be deposited by physical vapor deposition (PVD), chemical vapor deposition (CVD), electroplating, electroless plating, or a combination thereof. Excess portions of the at least one conductive material can be removed from above the top surface of the at least one contact level dielectric layer (71, 73) by a planarization process, which may employ a recess etch or chemical mechanical planarization (CMP). A contact via structure is formed within each backside trench 79, which is herein referred to as a substrate contact via structure 76. Each substrate contact via structure 76 can physically contact a portion of the substrate (9, 10, 61) such as a source region 61 of the substrate. In this case, the substrate contact via structure 76 can be a source contact via structure that can be employed to apply electrical bias to a respective source region 61.

Each substrate contact via structure 76 can be formed on an inner sidewall of a respective insulating spacer 74. Further, each substrate contact via structure 76 can also contact an annular vertical sidewall of a respective aluminum oxide layer 72 at a bottom portion of the aluminum oxide layer 72 having an L-shaped vertical cross-sectional area. Optionally, in case the insulating spacer 74 has a tapered sidewall at an upper portion, the substrate contact via structure 76 can contact the tapered sidewall 74A of the insulating spacer 74. If an anisotropic etch is employed and if the tapered sidewall 74A of the insulating spacer 74 is recessed with respect to a horizontal plane including the top surface of the at least one contact level dielectric layer (71, 73), the substrate contact via structure 76 can contact a substantially vertical sidewall of the aluminum oxide layer 72 exposed above the taper 74A in the upper part of the trench 79.

Figure 12:
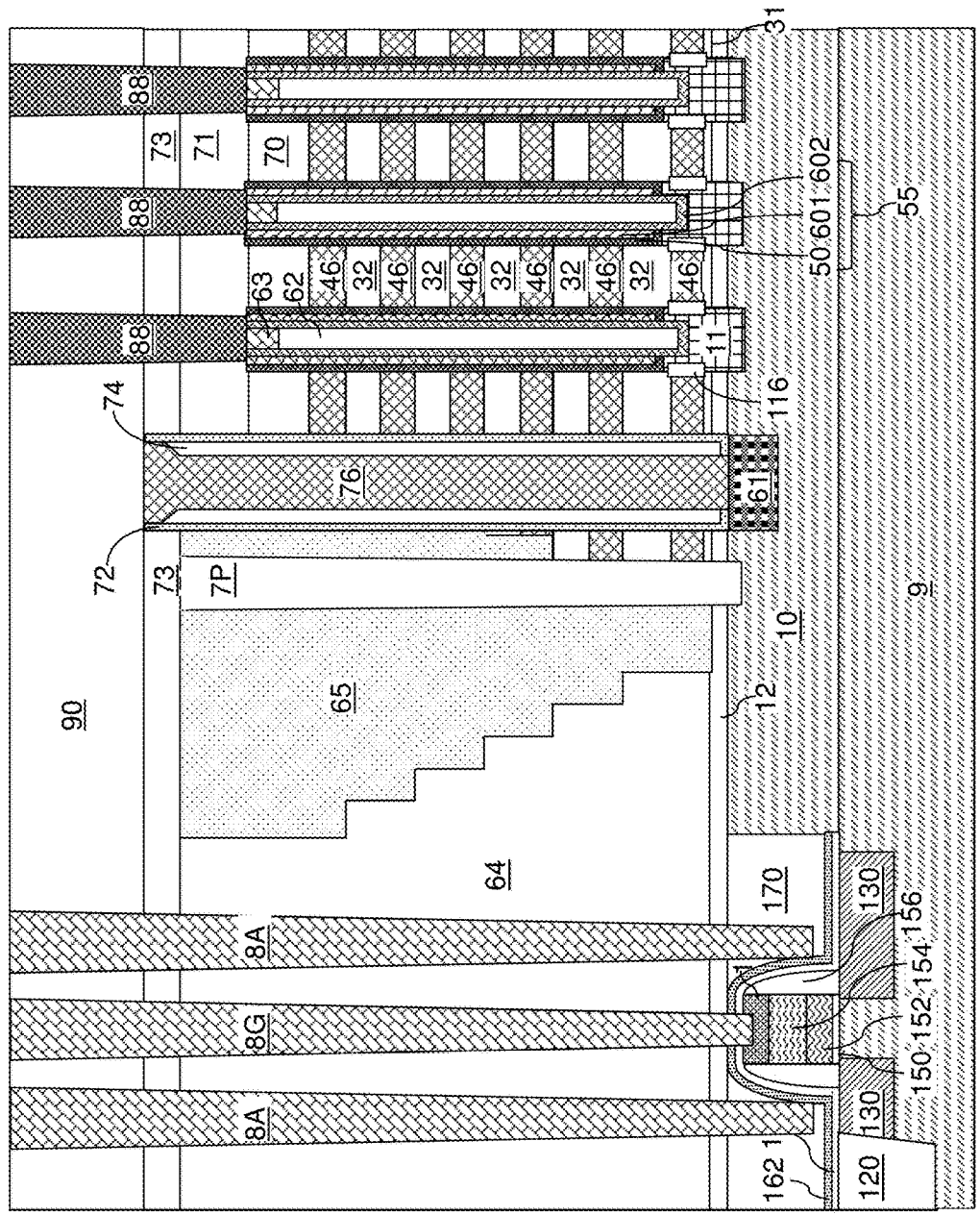
FIG. 12 is a vertical cross-sectional view of the first exemplary structure after formation of a via level dielectric material layer and additional contact via structures according to the first embodiment of the present disclosure.

Referring to FIG. 12, a via level dielectric layer 90 can be deposited over the at least one contact level dielectric layer (71, 73), the aluminum oxide layers 72, the insulating spacers 74, and the substrate contact via structures 76. As used herein, a "via level dielectric material layer" refers to a dielectric material layer through which at least one via structure, i.e., at least one vertically extending structure, is subsequently formed. The via level dielectric layer 90 can include a dielectric material such as silicon oxide, silicon nitride, silicon oxynitride, organosilicate glass, any porous derivative thereof, or a combination thereof. The via level dielectric layer 90 can be deposited by chemical vapor deposition or spin coating. The via level dielectric layer 90 can be deposited directly on the surfaces of the at least one contact level dielectric layer (71, 73), the aluminum oxide layers 72, and the substrate contact via structures 76.

Memory contact via structures 88 can be formed through the via level dielectric layer 90 and the first and second contact level dielectric layers (73, 71). For example, a photoresist layer can be applied over the via level dielectric layer 90, and can be lithographically patterned to form openings overlying the drain structures 63. Layer 73 may be used as an etch stop during formation of the openings. The etch may extend through layer 90 (e.g., a silicon oxide layer) and stop on layer 73 (e.g., a silicon nitride layer). Subsequent etching steps are then performed to extend the opening through layers 73 and 71. An anisotropic etch can be performed to transfer the pattern in the photoresist layer through the via level dielectric layer 90 and the first and second contact level dielectric layers (73, 71) to form memory contact via cavities. The photoresist layer can be subsequently removed, for example, by ashing. The memory contact via cavities can be filled with at least one conductive material. Excess portions of the at least one conductive material can be removed from above a horizontal plane including a top surface of the via level dielectric layer 90 by a recess etch and/or chemical mechanical planarization. Each remaining continuous portion of the at least one conductive material constitutes a memory contact via structure 88, which contacts a top surface of an underlying drain region 63.

Additional contact via structures can be formed by a combination of processes, which can include application and lithographic patterning of a photoresist layer, formation of via cavities employing an anisotropic etch, removal of the photoresist layer, and deposition and planarization of at least one conductive material. The additional contact via structures may be formed during the same steps or different steps as those used to form the memory contact via structures 88. For example, peripheral device contact via structures (8A, 8G) can be formed in the peripheral device region. The peripheral device contact via structures (8A, 8G) can include, for example, at least one active region contact via structure 8A and at least one gate electrode contact via structure 8G. Control gate contact via structures (not shown) can be formed in the stepped surface area of the contact region to provide electrical contact to the electrically conductive layers 46, which can function as control gate electrodes for the memory device including the memory stack structures 55. There is no short circuit between structures 88 and 76 due to the presence of the aluminum oxide etch stop layer 72 which prevents the trench 79 from extending into the opening for the memory contact via structure 88 during etching of the spacer 74.

Figure 13:
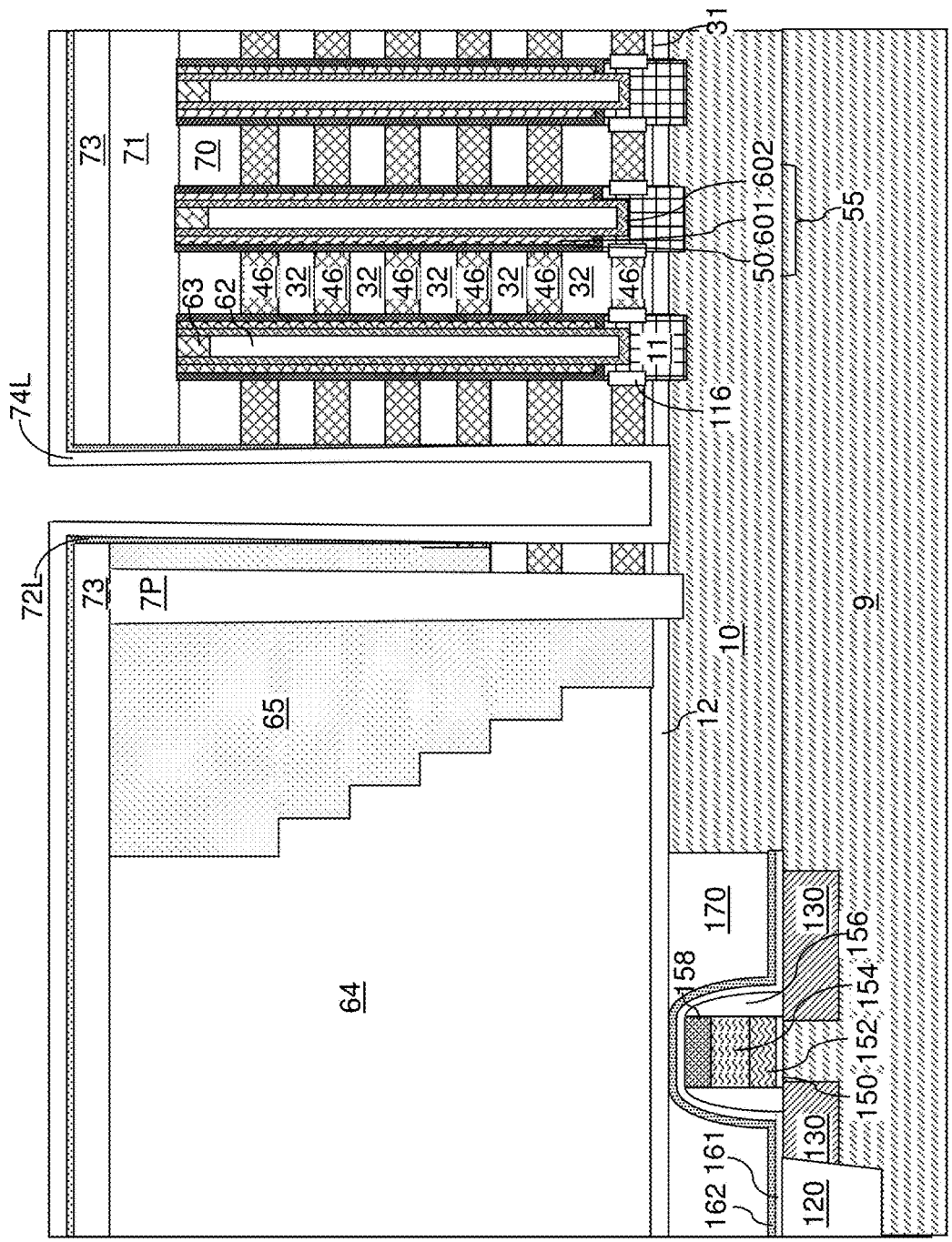
FIG. 13 is a vertical cross-sectional view of a second exemplary structure after formation of an aluminum oxide layer employing a depletive deposition process and formation of an insulating layer according to a second embodiment of the present disclosure.

Referring to FIG. 13, a second exemplary structure according to a second embodiment of the present disclosure can be derived from the first exemplary structure of FIG. 8 by forming an aluminum oxide layer 72 employing a depletive deposition process. The aluminum oxide layer 72L can be deposited by a non-conformal deposition process, which can be a depletive chemical vapor deposition (CVD) process, i.e., a CVD process that is performed in depletive deposition mode.

As used herein, a "depletive deposition mode" is a deposition mode in which the deposition rate is limited by supply of the reactant, i.e., by the amount of the reactant that is available for a deposition reaction. The process does not provide sufficient amount of reactants to the physically exposed surface within the backside trench 79, and the thickness of the deposited film decreases with distance from the main flow stream of the reactants. Thus, the thickness of the aluminum oxide layer 72 decreases inside each backside trench 79 with the vertical distance from the horizontal plane including the top surface of the at least one contact level dielectric layer (71, 73). In other words, the aluminum oxide layer 72 can have a variable thickness that increases with a vertical distance from a top surface of the substrate (9, 10) within each backside trench 79.

In one embodiment, the aluminum oxide layer 72 can be deposited on an upper portion of the sidewall of each backside trench 79. Specifically, the aluminum oxide layer 72 can be deposited directly on sidewalls of a subset of the electrically conductive layers 46 located in an upper portion of the alternating stack (32, 46), and directly on sidewalls of a subset of the insulating layers 32 located in the upper portion of the alternating stack (32, 46). In one embodiment, the aluminum oxide layer 72 is not deposited on a lower portion of the sidewalls of each backside trench 79 or at the bottom surface of each backside trench 79 during the depletive deposition process. In this case, the aluminum oxide layer 72 can have a uniform thickness in a horizontal portion that overlies the at least one contact level dielectric layer (71, 73) and have tapered thickness regions and are discontinuous inside the lower portions of the backside trenches 79. The number of discontinuities in the aluminum oxide layer 72 can be the same as the number of backside trenches 79.

An insulating material layer 74L can be deposited over the aluminum oxide layer 72 by a conformal deposition process such as a chemical vapor deposition process. The insulating material layer 74L includes a dielectric material such as silicon oxide, silicon nitride, silicon oxynitride, or a combination thereof. In one embodiment, the insulating material 74L can include undoped silicate glass (USG). The thickness of the insulating material layer 74L can be in a range from 3 nm to 30 nm, although lesser and greater thicknesses can also be employed. Thus, layer 74L contacts the sidewall of the lower portion of the trench 79 and top of the semiconductor material layer 10 and/or the source region 61 exposed at the bottom of the trench.

Figure 14:
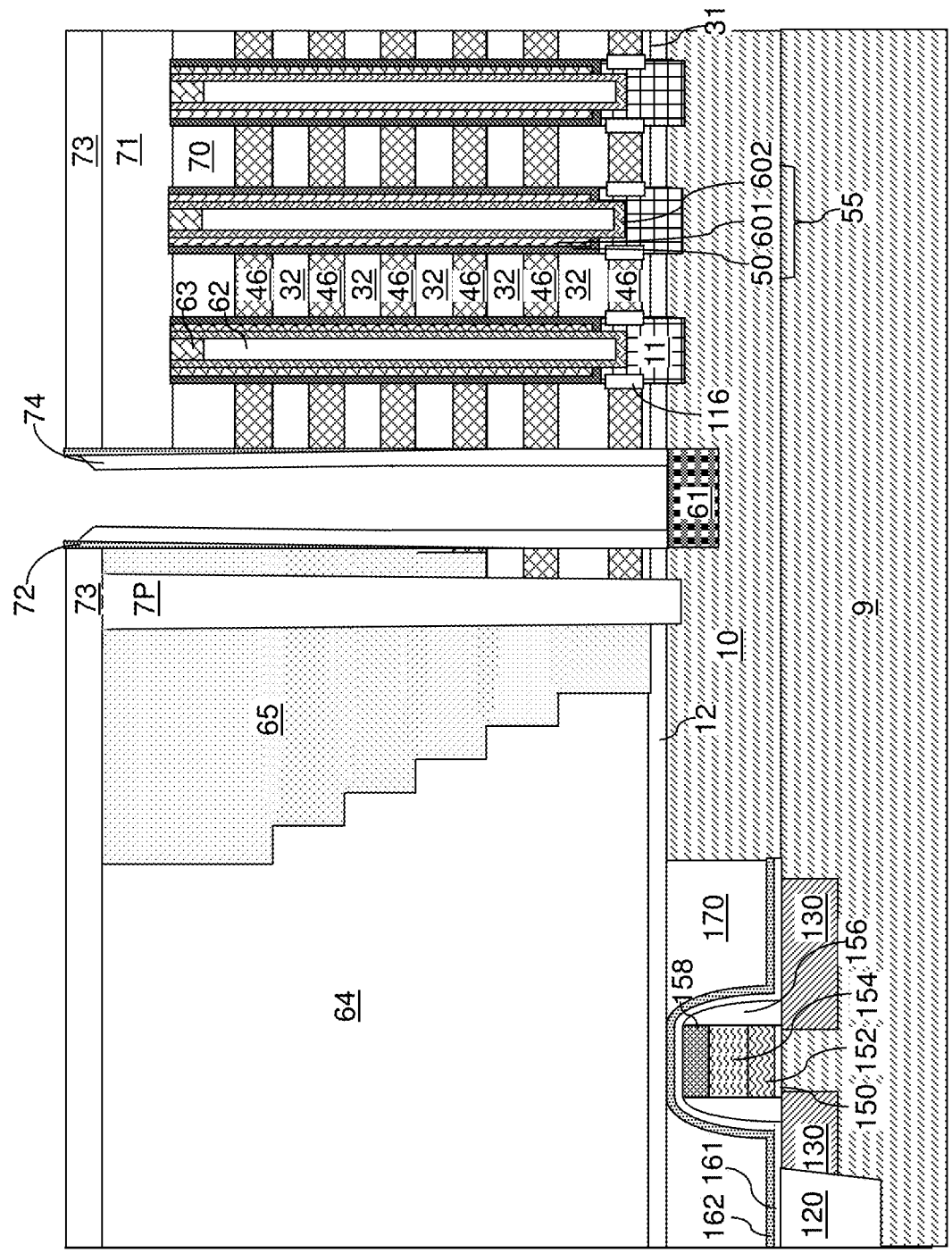
FIG. 14 is a vertical cross-sectional view of the second exemplary structure after formation of an insulating spacer and removal of horizontal portions of the aluminum oxide layer according to the second embodiment of the present disclosure.

Referring to FIG. 14, an anisotropic etch can be performed to remove horizontal portions of the insulating material layer 74L from above the at least one contact level dielectric layer (71, 73) and from a bottom portion of each backside trench 79. Each remaining portion of the insulating material layer 74L inside the backside trenches 79 constitutes an insulating spacer 74. The same processing steps can be employed to form the insulating spacers 74 as the processing steps of FIG. 10.

In case a portion of the backside trench 79 has a substantially rectangular horizontal cross-sectional area, the insulating spacer 74 can have a pair of parallel vertical portions laterally spaced from each other by a uniform distance. Further, each parallel vertical portion of the insulating spacer 74 can have a uniform lateral thickness at a bottom portion and a middle portion. The anisotropic etch can cause formation of tapers at the top portion of each insulating spacer 74. In this case, each insulating spacer 74 can have a tapered profile at a top portion. As in the prior embodiment, layer 72 may be used as an etch stop during the etching of layer 74L. In one embodiment, the insulating spacer 74 can be topologically homeomorphic to a torus.

Subsequently, an etch process can be employed to remove at least horizontal portions of the aluminum oxide layer 72L from above the at least one contact level dielectric layer (71, 73). The etch process can be an anisotropic etch process. An exemplary anisotropic etch process that can be employed to etch the horizontal portions of the aluminum oxide layer 72L can be a reactive ion etch employing $CCl_4$ and optionally Ar, or $BCl_3$ and optionally oxygen and/or Ar. Each discrete remaining portion of the aluminum oxide layer 72L constitutes an aluminum oxide layer 72. Each aluminum oxide layer 72 can be topologically homeomorphic to a torus. Each insulating spacer 74 is formed on an inner sidewall of a respective aluminum oxide layer 72. A source region 61 can be formed in the same manner as in the processing steps of FIG. 10.

Figure 15:
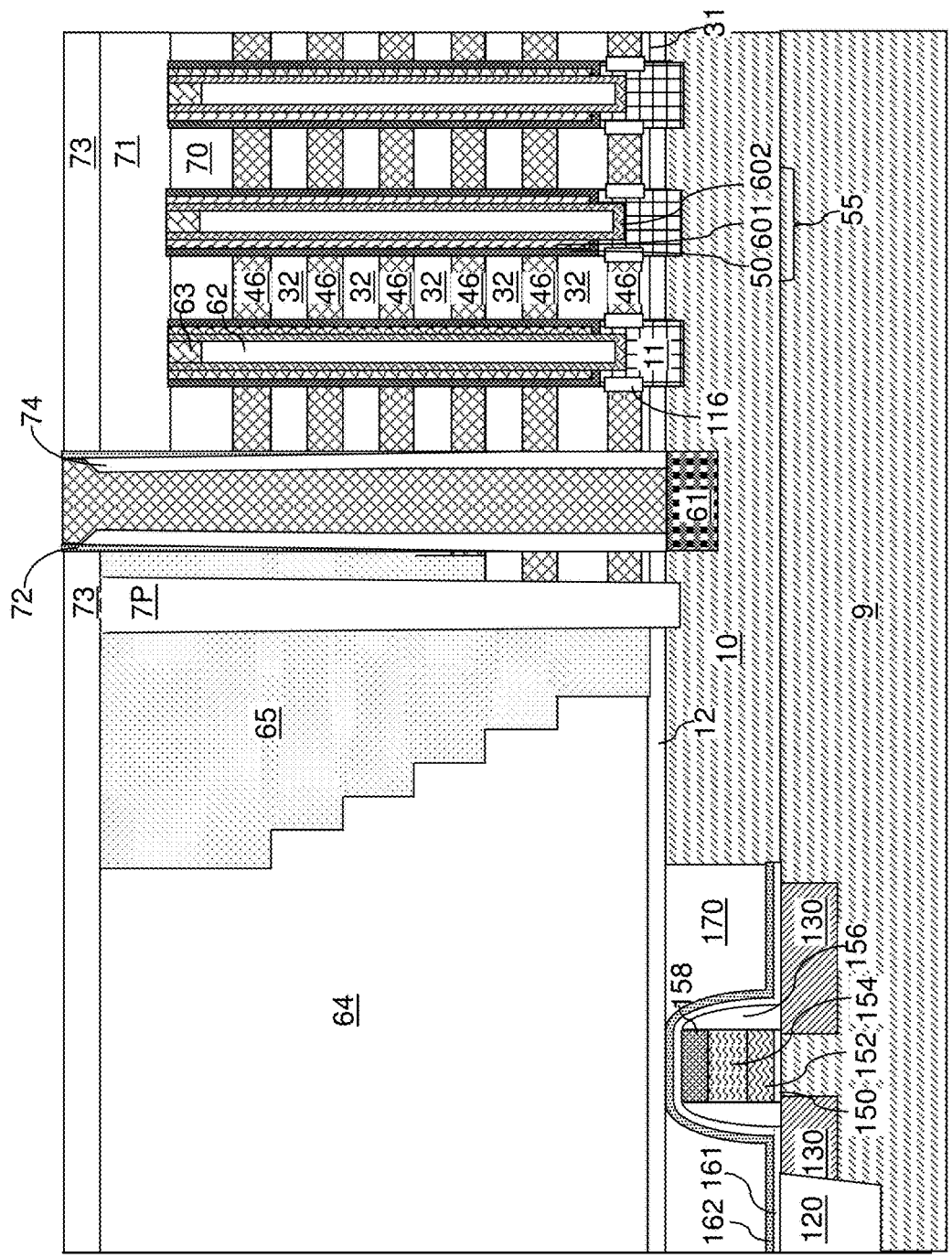
FIG. 15 is a vertical cross-sectional view of the second exemplary structure after formation of a substrate contact via structure according to the second embodiment of the present disclosure.

Referring to FIG. 15, the processing steps of FIG. 11 can be performed to form a substrate contact via structure 76. Each substrate contact via structure 76 can physically contact a portion of the substrate (9, 10, 61) such as a source region 61 of the substrate. In this case, the substrate contact via structure 76 can be a source contact via structure that can be employed to apply electrical bias to a respective source region 61.

Each substrate contact via structure 76 can be formed on an inner sidewall of a respective insulating spacer 74. Optionally, in case the insulating spacer 74 has a tapered sidewall at an upper portion, the substrate contact via structure 76 can contact the tapered sidewall of the insulating spacer 74. If an anisotropic etch is employed and if the tapered sidewall of the insulating spacer 74 is recessed with respect to a horizontal plane including the top surface of the at least one contact level dielectric layer (71, 73), the substrate contact via structure 76 can contact a substantially vertical sidewall of the aluminum oxide layer 72 exposed above the taper 74A in the upper part of the trench 79.

Figure 16:
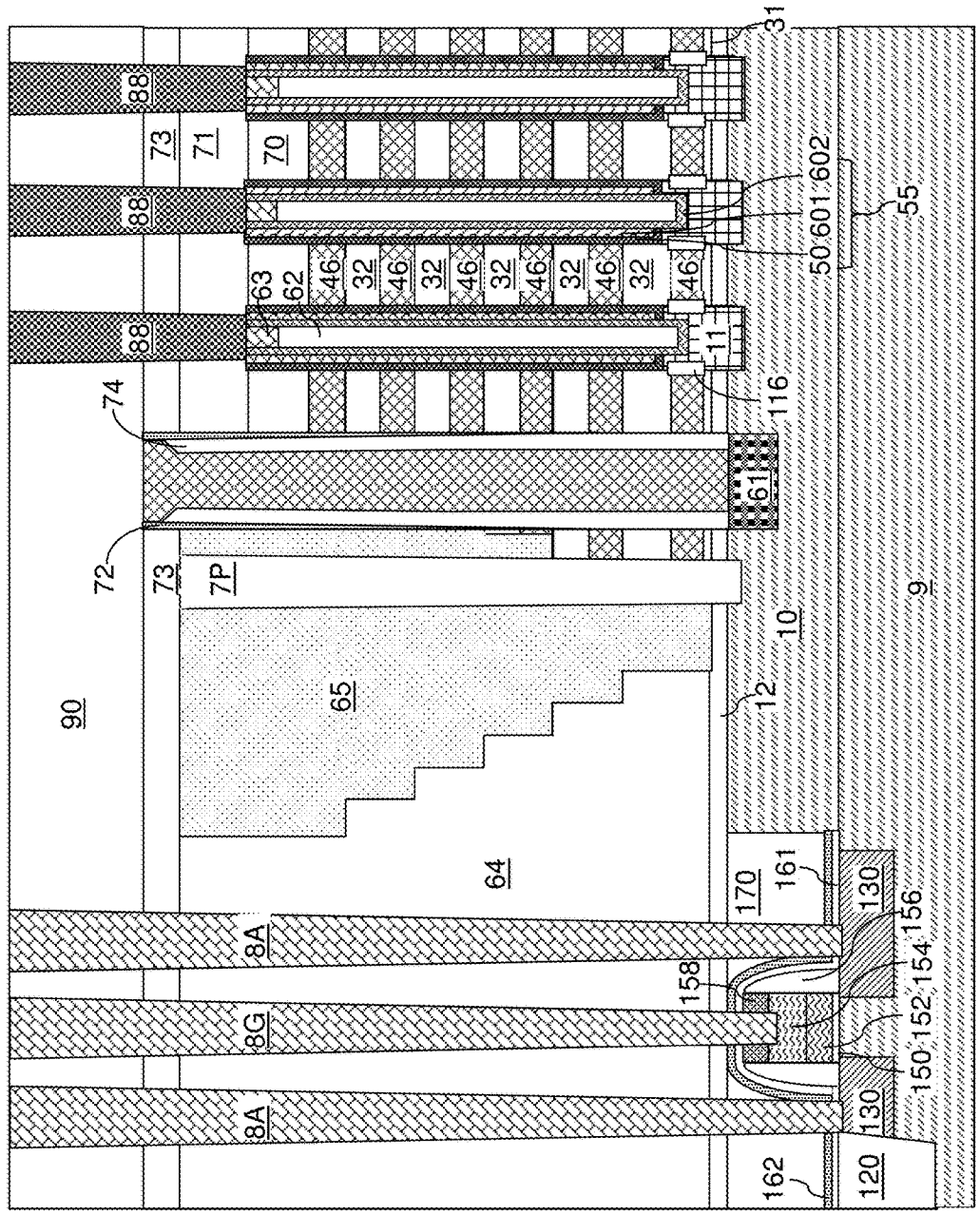
FIG. 16 is a vertical cross-sectional view of the second exemplary structure after formation of a via level dielectric material layer and additional contact via structures according to the second embodiment of the present disclosure.

Referring to FIG. 16, the processing steps of FIG. 12 can be performed to form a via level dielectric layer 90. The via level dielectric layer 90 can be deposited directly on the surfaces of the at least one contact level dielectric layer (71, 73), the aluminum oxide layers 72, and the substrate contact via structures 76. Memory contact via structures 88 and additional contact via structures (8G, 8A) can be formed in the same manner as in the first embodiment. In this embodiment, the overetch of the semiconductor material (e.g., the semiconductor material layer 10 and/or the source region 61) during etching of layer 72L at the bottom of the trench 79 may be reduced or avoided because the discontinuous aluminum oxide layer 72L is not formed at the bottom of the trench 79.

Figure 17:
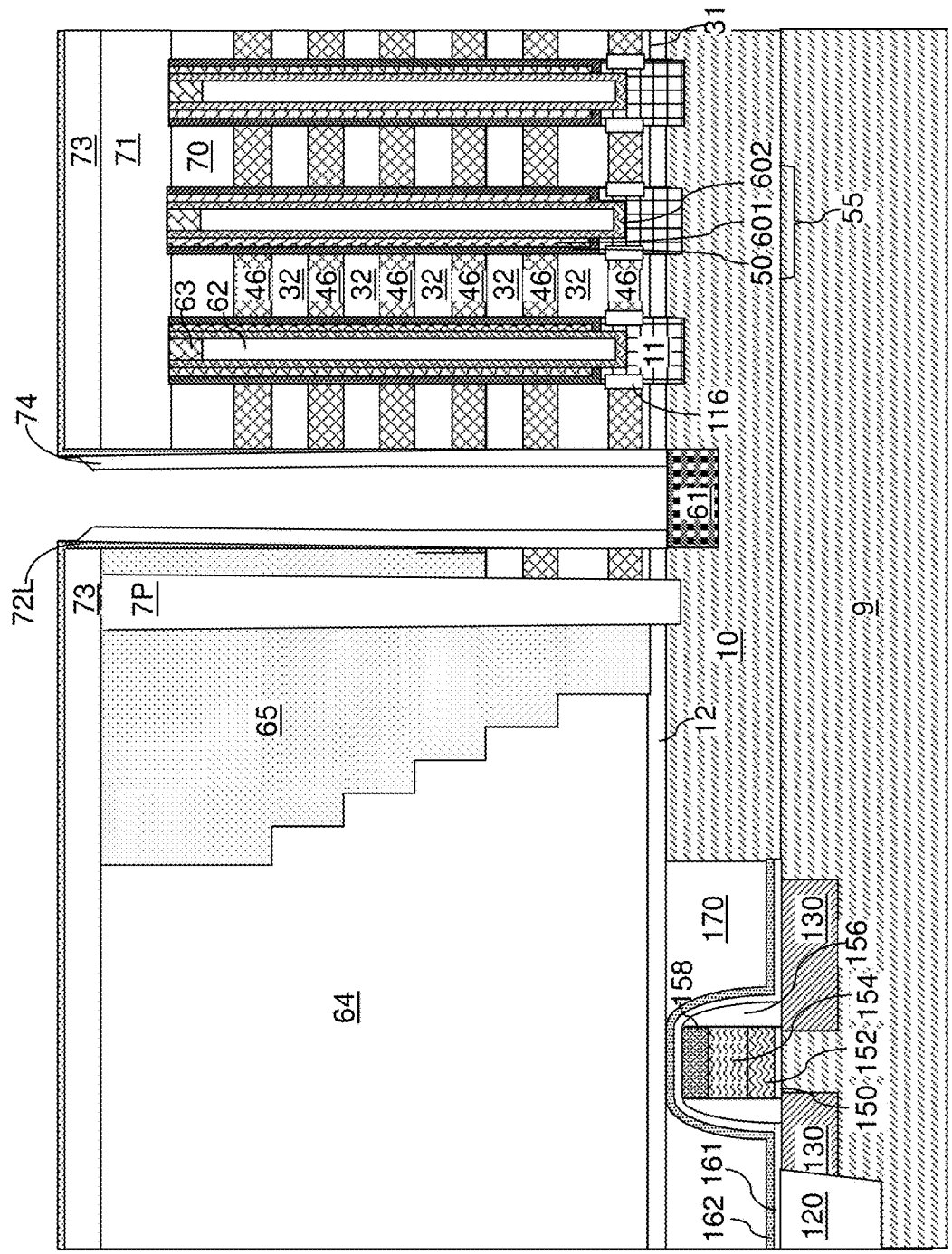
FIG. 17 is a vertical cross-sectional view of a third exemplary structure after formation of an insulating spacer and removal of horizontal portions of the aluminum oxide layer according to a third embodiment of the present disclosure.

Referring to FIG. 17, a third exemplary structure according to a third embodiment of the present disclosure can be derived from the second exemplary structure of FIG. 13 by anisotropically etching the insulating material layer 74L selective to the aluminum oxide layer 72. For example, if the insulating material layer 74L includes silicon oxide, a reactive ion etch employing a fluorocarbon reactant and optionally oxygen can be selective to aluminum oxide. In one embodiment, the anisotropic etch process of FIG. 14 can be employed to remove the horizontal portions of the insulating material layer 74L, and to form the insulating spacers 74 within the backside trenches 79.

The processing step of the anisotropic etch step of the horizontal portions of the aluminum oxide layer 72 employed in the first and second embodiments can be omitted in the third embodiment, or can be performed with significantly reduced duration to ensure removal of any residual aluminum oxide material, if any, from the bottom surfaces of the backside trenches 79. Thus, the horizontal portion of the aluminum oxide layer 72 overlying the at least one contact level dielectric layer (71, 73) can remain substantially intact at this process step. A source region 61 can be formed in the same manner as in the processing steps of FIG. 10.

Figure 18:
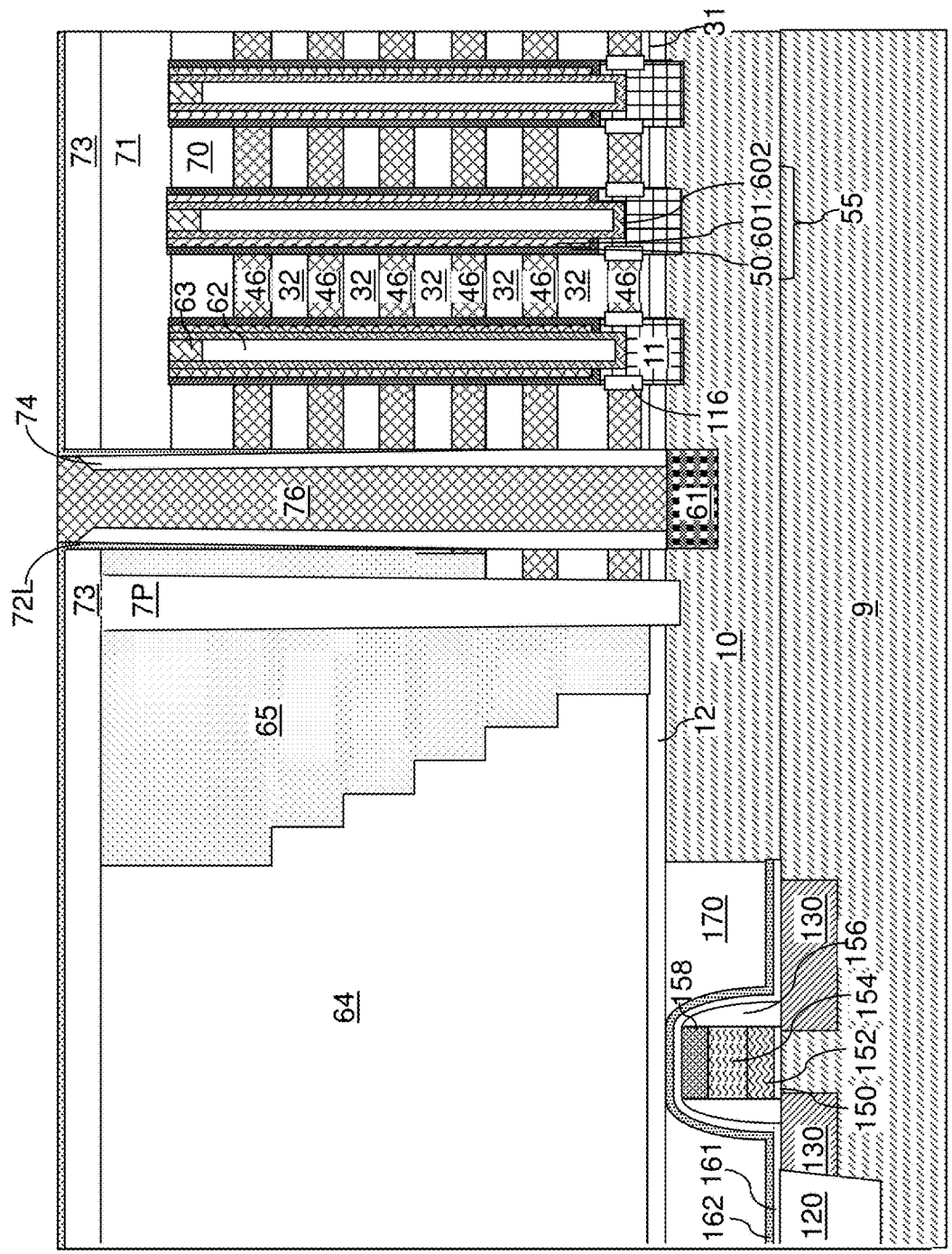
FIG. 18 is a vertical cross-sectional view of the third exemplary structure after formation of a substrate contact via structure according to the third embodiment of the present disclosure.

Referring to FIG. 18, the processing steps of FIG. 11 can be performed to form a substrate contact via structure 76. The aluminum oxide layer 72 can be employed as a stopping layer during a planarization process, which can employ a recess etch or chemical mechanical planarization. Each substrate contact via structure 76 can physically contact a portion of the substrate (9, 10, 61) such as a source region 61 of the substrate. In this case, the substrate contact via structure 76 can be a source contact via structure that can be employed to apply electrical bias to a respective source region 61.

Each substrate contact via structure 76 can be formed on an inner sidewall of a respective insulating spacer 74. Optionally, in case the insulating spacer 74 has a tapered sidewall at an upper portion, the substrate contact via structure 76 can contact the tapered sidewall of the insulating spacer 74. If an anisotropic etch is employed and if the tapered sidewall of the insulating spacer 74 is recessed with respect to a horizontal plane including the top surface of the at least one contact level dielectric layer (71, 73), the substrate contact via structure 76 can contact a substantially vertical sidewall of the aluminum oxide layer 72 exposed above the taper 74A in the upper part of the trench 79.

Figure 19:
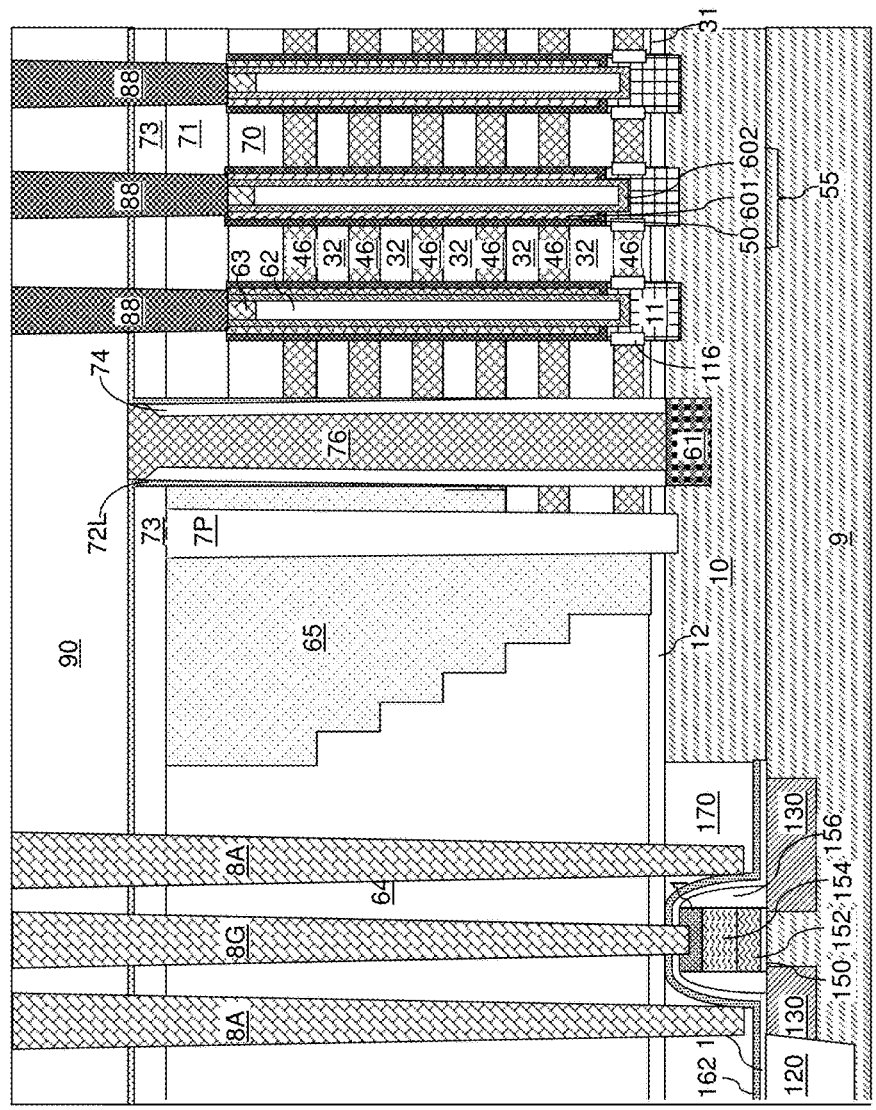
FIG. 19 is a vertical cross-sectional view of the third exemplary structure after formation of a via level dielectric material layer and additional contact via structures according to the third embodiment of the present disclosure.

Referring to FIG. 19, the processing steps of FIG. 12 can be performed to form a via level dielectric layer 90. The via level dielectric layer 90 can be deposited directly on the surfaces of the at least one contact level dielectric layer (71, 73), the aluminum oxide layers 72L, and the substrate contact via structures 76. Memory contact via structures 88 and additional contact via structures (8G, 8A) can be formed in the same manner as in the first embodiment. The horizontal portion of the aluminum oxide layer 72 located above the stack (32, 46) may be used as an etch stop during formation of openings for the memory contact via structures 88 instead of layer 73. Thus, in this embodiment, the extra layer 73 (e.g., silicon nitride layer) may be omitted.

The various exemplary structures of the present disclosure can include a three-dimensional memory device. The three-dimensional memory device can comprise an alternating stack of insulating layers 32 and electrically conductive layers 46 located over a substrate (9, 10); a trench 79 extending through the stack of alternating layers; an aluminum oxide layer 72 located on at least an upper portion of a sidewall of the trench 79; a contact via structure located inside the aluminum oxide layer 72 in the trench 79; and a via level dielectric layer 90 located over the aluminum oxide layer 72 and the contact via structure 76. The aluminum oxide layer 72 can be in contact with sidewalls of at least a subset of the electrically conductive layers 46 located in an upper portion of the alternating stack, and in contact with sidewalls of a subset of the insulating layers 32 located in the upper portion of the alternating stack.

The trench 79 can have a pair of substantially vertical sidewalls that extend along a same horizontal direction with a uniform width (i.e., a lateral separation distance) that is invariant along the horizontal direction. In one embodiment, the sidewall of each trench 79 can extend substantially vertically from the substrate (9, 10) to a topmost layer in the alternating stack, and the entire outer sidewall of the aluminum oxide layer 72 in the trench 79 can contact the entire sidewalls of the trench 79.

The aluminum oxide layer 72 can have a variable thickness that increases with a vertical distance from a top surface of the substrate (9, 10) as in the second and third embodiments. In this case, the aluminum oxide layer 72 does not contact sidewalls of at least one bottom electrically conductive layer 46 and of at least one bottom insulating layer 32 in the alternating stack.

At least one contact level dielectric layer (71, 73) can contact an outer sidewall of the aluminum oxide layer 72 and a bottom surface of the via level dielectric layer 90 as in the first and second embodiments. Alternatively, at least one contact level dielectric layer 90 can contact an outer sidewall of the aluminum oxide layer 72 and optionally a top surface of a horizontal portion of the aluminum oxide layer 72 in the third embodiment described above and shown in FIG. 19.

An insulating spacer 74 can be located on a sidewall of the aluminum oxide layer 72 and can be located between layer 72 and the contact via structure 76. Memory stack structures 55 can extend through the alternating stack. Each of the memory stack structures 55 can comprise a memory film 50 and a vertical semiconductor channel 60 comprising layers (601, 602) extending substantially perpendicular to a top (e.g., major) surface 7 of the substrate (9, 10).

In one embodiment, the monolithic three-dimensional memory device comprises a vertical NAND device located over the substrate, and the electrically conductive layers 46 comprise, or are electrically connected to, a respective word line of the NAND device. In one embodiment, the substrate (9, 10) comprises a silicon substrate, the vertical NAND device comprises an array of monolithic three-dimensional NAND strings located over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon.

The array of monolithic three-dimensional NAND strings can comprise a plurality of semiconductor channels 60. At least one end portion of each of the plurality of semiconductor channels 60 extends substantially perpendicular to a top surface of the substrate. The array of monolithic three-dimensional NAND strings can comprise a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes comprises at least a first control gate electrode located in the first device level and a second control gate electrode located in the second device level.

The aluminum oxide layer 72 functions as an etch stop layer during the anisotropic etch that forms the insulating spacers 74. Thus, the various embodiments of the present disclosure can be employed to prevent collateral widening of the backside trenches 79 during the anisotropic etch process that forms the insulating spacers 74. By preventing removal of portions of the at least one contact level dielectric layer (71, 73) around the initial volume of the backside trenches 79, the volume of the substrate contact via structures 76 can be confined within the initial volume of the backside trenches 79, and undesirable electrical shorts between the memory contact via structures 88 and substrate contact via structures 76 can be avoided.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a device structure, comprising:
   forming a stack of alternating layers comprising insulating layers and electrically conductive layers over a substrate;
   forming a trench through the stack of alternating layers;
   forming an aluminum oxide layer over at least an upper portion of a sidewall of the trench;
   forming an insulating layer over a sidewall of the aluminum oxide layer and over a bottom of the trench;
   etching the insulating layer to remove the insulating layer from over the bottom of the trench to form an insulating spacer using the aluminum oxide layer as an etch stop; and
   forming a contact via structure inside the insulating spacer in the trench.

2. The method of claim 1, further comprising forming a source region in the substrate below the trench by implanting dopants into the substrate through the trench, wherein the substrate contact via structure comprises a source contact via structure which contacts the source region.

3. The method of claim 1, wherein:
   the aluminum oxide layer is formed directly on sidewalls of at least a subset of the electrically conductive layers located in an upper portion of the alternating stack; and
   the aluminum oxide layer is formed directly on sidewalls of at least a subset of the insulating layers located in the upper portion of the alternating stack.

4. The method of claim 1, further comprising:
   depositing a continuous conformal aluminum oxide layer having a substantially uniform thickness throughout on the sidewall of the trench; and
   etching the continuous conformal aluminum oxide layer to remove horizontal portions of the continuous conformal aluminum oxide layer to leave the aluminum oxide layer over at least the upper portion of a sidewall of the trench.

5. The method of claim 4, wherein:
   the sidewall of the trench extends substantially vertically from the substrate to a topmost layer in the alternating stack; and
   an entire outer sidewall of the aluminum oxide layer contacts the entire sidewall of the trench.

6. The method of claim 1, wherein the aluminum oxide layer is deposited in a depletive deposition process with a variable thickness that increases with a vertical distance from a top surface of the substrate.

7. The method of claim 6, wherein the aluminum oxide layer is not deposited on a lower portion of the sidewall of the trench during the depletive deposition process.

8. The method of claim 6, further comprising removing a horizontal portion of the aluminum oxide layer from above the alternating stack prior to formation of the contact via structure.

9. The method of claim 6, further comprising forming a via level dielectric layer over the aluminum oxide layer and the contact via structure, wherein the via level dielectric layer is formed over a horizontal portion of the aluminum oxide layer that overlies the alternating stack.

10. The method of claim 1, wherein etching the insulating layer forms a taper in a top portion of the insulating spacer and exposes an upper portion of the aluminum oxide layer above the taper in the top portion of the insulating layer in the trench, and wherein the contact via structure contacts the exposed upper portion of the aluminum oxide layer.

11. The method of claim 2, further comprising forming memory stack structures prior to forming the trench, wherein each of the memory stack structures extends through the alternating stack, and comprises a memory film and a vertical semiconductor channel extending substantially perpendicular to a top surface of the substrate.

12. The method of claim 11, further comprising:
   forming an in-process alternating stack of the insulating layers and sacrificial material layers, wherein the memory stack structures are formed through the in-process alternating stack;
   forming backside recesses by removing the sacrificial material layers selective to the insulating layers by introducing an etchant through the trench; and
   forming the electrically conductive layers in the backside recesses, whereby the alternating stack is formed.

13. The method of claim 11, wherein:
   the device structure comprises a vertical NAND device located over the substrate;
   the electrically conductive layers comprise, or are electrically connected to, a respective word line of the NAND device;
   the substrate comprises a silicon substrate;
   the vertical NAND device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon; and
   the array of monolithic three-dimensional NAND strings comprises:
      a plurality of semiconductor channels, wherein at least one end portion of each of the plurality of semiconductor channels extends substantially perpendicular to a top surface of the substrate;
      a plurality of charge storage elements, each charge storage element located adjacent to a respective one of the plurality of semiconductor channels; and
      a plurality of control gate electrodes having a strip shape extending substantially parallel to the top surface of the substrate, the plurality of control gate electrodes comprise at least a first control gate electrode located in the first device level and a second control gate electrode located in the second device level.

14. A three-dimensional memory device, comprising:
an alternating stack of insulating layers and electrically conductive layers located over a substrate;
a trench extending through the stack of alternating layers;
an aluminum oxide layer located over at least an upper portion of a sidewall of the trench;
an insulating spacer located over a sidewall of the aluminum oxide layer; and
a contact via structure located inside the insulating spacer in the trench.

15. The three-dimensional memory device of claim 14, further comprising a source region located in the substrate below the trench, wherein the contact via structure comprises a source contact via structure which contacts the source region.

16. The three-dimensional memory device of claim 14, wherein:
the aluminum oxide layer is in contact with sidewalls of at least a subset of the electrically conductive layers located in an upper portion of the alternating stack; and
the aluminum oxide layer is in contact with sidewalls of at least a subset of the insulating layers located in the upper portion of the alternating stack.

17. The three-dimensional memory device of claim 14, wherein:
the sidewall of the trench extends substantially vertically from the substrate to a topmost layer in the alternating stack; and
an entire outer sidewall of the aluminum oxide layer contacts the entire sidewall of the trench.

18. The three-dimensional memory device of claim 14, wherein the aluminum oxide layer has a variable thickness that increases with a vertical distance from a top surface of the substrate.

19. The three-dimensional memory device of claim 18, wherein the aluminum oxide layer does not contact sidewalls of at least one bottom electrically conductive layer and of at least one bottom insulating layer in the alternating stack.

20. The three-dimensional memory device of claim 18, further comprising:
a via level dielectric layer located over the aluminum oxide layer and the contact via structure; and
at least one contact level dielectric layer that contacts an outer sidewall of the aluminum oxide layer and a bottom surface of the via level dielectric layer.

21. The three-dimensional memory device of claim 18, further comprising at least one contact level dielectric layer that contacts an outer sidewall of the aluminum oxide layer and a bottom surface of a horizontal portion of the aluminum oxide layer located over the alternating stack.

22. The three-dimensional memory device of claim 14, wherein:
a taper is located in a top portion of the insulating spacer; and
the contact via structure contacts an exposed upper portion of the aluminum oxide layer above the taper.

23. The three-dimensional memory device of claim 15, further comprising memory stack structures extending through the alternating stack, wherein each of the memory stack structures comprises a memory film and a vertical semiconductor channel extending substantially perpendicular to a top surface of the substrate.

24. The three-dimensional memory device of claim 23, wherein:
the three-dimensional memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *